(12) United States Patent
Imazato

(10) Patent No.: US 6,678,858 B1
(45) Date of Patent: Jan. 13, 2004

(54) CODE ERROR MONITOR APPARATUS

(75) Inventor: Takashi Imazato, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/471,371

(22) Filed: Dec. 23, 1999

(30) Foreign Application Priority Data

Jul. 12, 1999 (JP) .......................................... 11-197648

(51) Int. Cl.$^7$ .......................... H03M 13/00; G06F 11/00
(52) U.S. Cl. ......................................... 714/758; 714/52
(58) Field of Search ........................... 714/52, 48, 758, 714/734, 43, 774, 799

(56) References Cited

U.S. PATENT DOCUMENTS 5,581,715 A * 12/1996 Verinsky et al. ............... 714/48
6,092,231 A * 7/2000 Sze ............................. 714/758
6,467,060 B1 * 10/2002 Malakapalli et al. ....... 714/758

FOREIGN PATENT DOCUMENTS

JP SHO 58-172043 A 10/1983
JP SHO 63-212234 A 9/1988
JP HEI-87061 A 3/1995

* cited by examiner

*Primary Examiner*—Albert Decady
*Assistant Examiner*—Cynthia Britt
(74) *Attorney, Agent, or Firm*—Staas & Halsey LLP

(57) ABSTRACT

A code error monitor apparatus has a data bus composed of a data bus on the CPU side and an internal data bus. An A-system code error detecting circuit detects a code error in the data bus on the CPU side. A B-system error correcting code generating circuit provided on a downstream side of the A-system code error detecting circuit generates a B-system error correcting code. A B-system code error detecting circuit detects a code error in the internal data bus. An A-system code error detecting circuit provided on a downstream side of the B-system error correcting code generating circuit detects a code error of data passing through a particular portion. When a code error occurs, the A-system code error detecting circuit outputs an A-system code error detecting signal of "1".

7 Claims, 28 Drawing Sheets

| ERROR_A2 | ERROR_A3 | ERROR_A4 | ERROR |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

| ERROR_A2 | DATA_B[n:0] | DP_AB |
|---|---|---|
| 0 | DATA_A[n:0] | DP_A |
| 1 | DATA_H[n:0] | DP_H |

| ERROR_CHK_ON | ERROR_A2 | PERROR |
|---|---|---|
| 0 | 0 | 0 |
| 0 | 1 | 0 |
| 1 | 0 | 0 |
| 1 | 1 | 1 |

CODE ERROR MONITOR APPARATUS

FIELD OF THE INVENTION

The present invention relates to a code error monitor apparatus for monitoring a code error generated in data transmitted through a transmission line (for example, data bus) More specifically, this invention relates to a code error monitor apparatus which can be suitably used for a transmission line that adopts two different types of systems for detecting a code error.

BACKGROUND OF THE INVENTION

In recent years, with an increase in the data processing speed in an information processing apparatus an amount of data in a transmission line such as a data bus is also increasing remarkably. When the amount of data to be transmitted increases a code error becomes a problem. Accordingly, in a conventional manner, in order to detect a code error, an error correcting code (a redundant bit) is added to the data to be transmitted so that the code error is detected by the code error detecting systems such as a known odd parity check system and even parity check system, and thus the code error is corrected.

In addition, in a computer system, a CPU (Central Processing Unit) is connected with a apparatus (memory, display, etc.) to be controlled by a system bus composed of a plurality of buses, and occasionally different code error detecting systems are adopted for each bus. In such a system also it is required to suppress a rate of generation of malfunction due to a code error as low as possible.

FIG. 28 is a block diagram showing a structure of the main sections of a conventional code error monitor apparatus. The code error monitor apparatus shown in FIG. 28 detects a code error in data to be transmitted through a data bus according to two different code error detecting systems, and corrects the code error based on the detected results. In FIG. 28, a data bus 1A on the CPU side transmits bit data DATA_A[0] through bit data DATA_A[n] of (n+1) bits, and its one end is connected with a not shown CPU.

In addition, the data bus 1A on the CPU side is provided with a data line for transmitting A-system error correcting code DP_A. The A-system error correcting code DP_A is a redundant bit for detecting a code error in bit data DATA_A[0] through bit data DATA_A[n] according to a system A (for example, odd parity check system). In this odd parity check system, A-system error correcting code DP_A of "1" or "0" is added as a redundant bit to a bit string of (n+1) bits composed of the bit data DATA_A[0] through bit data DATA_A[n] so that a number of "1" becomes an odd number in the bit data DATA_A[0] through bit data DATA_A[n] and in A-system error correcting code DP_A.

That is, in the odd parity check system, when the number of "1" in the bit string of (n+1) bits is an even number, the A-system error correcting code DP_A of "1" is added to the bit string. On the other hand, when the number of "1" in the bit string of (n+1) bits is an odd number, A-system error correcting code DP_A of "0" is added to the bit string. The bit string composed of ((n+1)+1) bits where the A-system error correcting code DP_A is added to the bit data DATA_A[0] through bit data DATA_A[n] is referred to as an A-system bit string in the following description.

One end of an internal data bus 1B is connected with the data bus 1A on the CPU side, and the other end is connected with a not shown apparatus (for example, memory) to be controlled. That is, the data bus 1A on the CPU side and the internal data bus 1B form a data bus which connects the CPU and the apparatus to be controlled. The internal data bus 1B transmits the bit data DATA_A[0] through bit data DATA_A[n] transmitted on the data bus 1A on the CPU side as bit data DATA_B[0] through bit data DATA_B[n] to the apparatus to be controlled.

That is, similarly to the data bus 1A on the CPU side, the internal data bus 1B transmits bit data DATA_B[0] through bit data DATA_B[n] of (n+1) bits. Moreover, the internal data bus 1B is provided with a data line for transmitting a B-system error correcting code DP_B. The B-system error correcting code DP_B is a redundant bit for detecting a code error in the bit data DATA_B[0]) through bit data DATA_B[n] according to a system B (for example, even parity check system).

In this even parity check system, the B-system error correcting code DP_B of "1" or "0" is added as a redundant code to the bit string of (n+1) bits composed of the bit data DATA_B[0] through bit data DATA_B[n] so that a number of "1" in the bit data DATA_B[0] through bit data DATA_B[n] and in the B-system error correcting code DP_B becomes an even number.

That is, in the even parity check system, when "1" in the bit string of (n+1) bits is an odd number, the B-system error correcting code DP_B of "1" is added to the bit string. On the other hand, when a number of "1" in the bit string of (n+1) bits is an even number, the B-system error correcting code DP_B of "0" is added to the bit string. The bit string composed of ((n+1)+1) bits where the B-system error correcting code DP_B is added to the bit data DATA_B[0] through bit data DATA_B[n] is referred to as a B-system bit string in the following description.

Thus, in the data bus composed of the data bus 1A on the CPU side and the internal data bus 1B, two different types of code error detecting systems: the system A (odd parity check system) and the system B (even parity check system) are adopted. A A-system code error detecting circuit 2 detects a code error based on the number of "1" in the A-system bit string (bit data DATA_A[0] through bit data DATA_A[n] and A-system error correcting code DP_A) according to the system A (odd parity check system).

More specifically, when the number of "1" in the A-system bit string is an even number then the A-system code error detecting circuit 2 judges that a code error has occurred in the data bus 1A on the CPU side and outputs an A-system code error detecting signal ERROR_A of "1" to the CPU. On the other hand, when the number of "1" in the A-system bit string is an odd number then the A-system code error detecting circuit 2 judges that a code error has not occurred in the data bus 1A on the CPU side and outputs an A-system code error detecting signal ERROR A of "0" to the CPU.

A B-system error correcting code generating circuit 3 is provided on a downstream side of the A-system code error detecting circuit 2, and generates a B-system error correcting code DP_B of "1" or "0" so that the number of "1" in the bit string of (n+2) bits composed of the bit data DATA_A[0] through bit data DATA_A[n] and the B-system error correcting code DP_B becomes an even number. A B-system code error detecting circuit 4 is provided on a downstream side of the B-system error correcting code generating circuit 3. This B-system code error detecting circuit 4 detects a code error based on the number of "1" in the B-system bit string (bit data DATA_B[0] through bit data DATA_B[n] and B-system error correcting code DP_B) according to the system B.

More specifically, when the number of "1" in the B-system bit string is an odd number then the B-system code error detecting circuit 4 judges that a code error has occurred in the internal data bus 1B and outputs a B-system code error detecting signal ERROR_B of "1" to the CPU. On the other hand, when the number of "1" in the B-system bit string is an even number then the B-system code error detecting circuit 4 judges that a code error has not occurred in the internal data bus 1B and outputs a B-system code error detecting signal ERROR_B of "0" to the CPU.

In addition, in the conventional code error monitor apparatus, a code error is detected according to the system A on an upstream side of a point 'a' on the data bus composed of the data bus 1A on the CPU side and the internal data bus 1B, whereas a code error is detected according to the system B on a downstream side of a point 'b'.

In the above constitution, when the A-system bit string is driven to the data bus 1A on the CPU side by the CPU (not shown), the A-system bit string is input into the A-system code error detecting circuit 2 positioned on the point 'a'. Here, if a code error does not occur in the data bus 1A on the CPU side, the A-system code error detecting circuit 2 outputs an A-system code error detecting signal ERROR_A of "0" to the CPU. Then, the B-system error correcting code generating circuit 3 positioned on the point 'b' generates a B-system error correcting code DP_B based on normal bit data DATA_A[0] through bit data DATA_A[n], and outputs the B-system error correcting code DP_B to the B-system code error detecting circuit 4.

If a code error does not occur in the bit data DATA_B[0] through bit data DATA_B[n] transmitted in the internal data bus 1B then the B-system code error detecting circuit 4 outputs a B-system code error detecting signal ERROR_B of "0" to the CPU. Normal bit data DATA_B[O] through bit data DATA_B[n] are then input into the apparatus to be controlled. Thus, when a code error does not occur in both the data bus 1A on the CPU side and the internal data bus 1B then the bit data DATA_A[0] through bit data DATA_A[n] driven by the CPU are input as bit data DATA_B[0] through bit data DATA_B[n] to the apparatus to be controlled.

On the other hand, when a code error occurs in the data bus 1A on the CPU side then the A-system code error detecting circuit 2 outputs a A-system code error detecting signal ERROR_A of "1" to the CPU. As a result, the CPU executes error correction such as retransmission of the bit data DATA_A[0] through bit data DATA_A[n] where a code error occurred.

Similarly, when a code error occurs in the internal data bus 1B then the B-system code error detecting circuit 4 outputs B-system code error detecting signal ERROR_B of "1" to the CPU. As a result, the CPU executes error correction such as retransmission of the bit data DATA_A [0] through bit data DATA_A[n] which are original data corresponding to the bit data DATA_B[0] through bit data DATA_B[n] where the code error has occurred.

As mentioned above, in the conventional code error monitor apparatus, a code error is detected according to the system A on the upstream side of the point 'a' in the data bus composed of the data bus 1A on the CPU side and the internal bus 1B shown in FIG. 28, and a code error is detected according to the system B on the downstream side of the point 'b'. The portion Z between the points 'a' and 'b' is positioned between a portion (portion on the upstream side of the point 'a') where the code error is detected according to the system A and a portion (portion on the downstream side of the point 'b') where a code error is detected according to the system B. Thus, this Z is a portion where a code error is not detected at all.

When a code error occurs in the portion Z then the B-system error correcting code generating circuit 3 generates an incorrect B-system error correcting code DP_B based on incorrect bit data DATA_A[0] through bit data DATA_A[n]. However, in the conventional code error monitor apparatus there is no provision to check whether or not the B-system error correcting code DP_B is a correct code. Therefore, even if the B-system error correcting code DP_B is incorrect it is treated as a correct code.

Further, the B-system code error detecting circuit 4 treats the B-system bit string including the incorrect B-system error correcting code DP_B as a correct data so that the code error cannot be detected accurately. The bit data DATA_B[0] through bit data DATA_B[n] where a code error has occurred are input as they are into the apparatus to be controlled so that a malfunction occur.

Thus, in the conventional code error monitor apparatus, malfunction due to a code error is caused by existence of a portion where a code error cannot be detected, and hence reliability and quality of the apparatus is deteriorated.

SUMMARY OF THE INVENTION

The present invention has been made in light of the above problems. It is an object of the present invention to provide a code error monitor apparatus which is capable of preventing malfunction due to a code error even if different code detecting systems are adopted and capable of improving reliability and quality.

According to the first aspect of the invention, a A-system code error detecting unit is provided on the downstream side of the B-system error correcting code generating unit, so that even if a code error occurs in the data used in the B-system error correcting code generating unit, the A-system code error detecting unit detects the code error. Thus, according to the first aspect of the invention, even when different code error detecting systems, i.e., the system A and system B are adopted in the data transmission line, the A-system code error detecting unit can detect a code error of the data used in the B-system error correcting code generating unit. As a result, malfunction due to the code error can be prevented based on the detected result, and reliability and quality can be improved.

According to the second aspect of the invention, a code error which occurred on the downstream side of the A-system code error detecting unit on upstream side is detected by a A-system code error detecting unit so that reliability of the data used in the B-system error correcting code generating unit can be verified. Therefore, according to the second aspect of the invention, malfunction due to the code error can be prevented based on the detected result of the A-system code error detecting unit, and reliability and quality can be improved.

According to the third aspect of the invention, a A-system code error detecting unit is provided on the downstream side of the B-system error correcting code generating unit so that even if a code error occurs in the data used in a B-system error correcting code generating unit, the code error is detected by the A-system code error detecting unit. The correcting unit corrects the code error of the data based on the detected result of the A-system code error detecting unit. Thus, according to the third aspect of the invention, even if different code error detecting systems, i.e., the system A and system B are adopted in the data transmission line, after the A-system code error detecting unit detects a code error of the data used in the B-system error correcting code generating unit, the correcting unit corrects the code error. As a result, malfunction due to the code error can be prevented, and reliability and quality can be improved.

According to the fourth aspect of the invention, a correcting unit corrects a code error of the data based on the detected results of a plurality of A-system code error detecting units. Thus, according to the fourth aspect of the invention, since the plural detected results are used, code error detecting accuracy can be improved further than the case where a code error is detected by using one detected result, and a code error can be corrected accurately.

According to the fifth aspect of the invention, on the data transmission line and branch data transmission lines, a code error is detected by a A-system code error detecting unit and A-system code error detecting unit on branch side. Then, a selection circuit selects data on the data transmission line or data on the branch data transmission line based on the detected results of the A-system code error detecting unit and the A-system code error detecting unit on branch side, and the selected data are transmitted to the downstream side. In the case where the A-system code error detecting unit detects a code error, for example, the selection unit transmits the data on the branch data transmission lines where the code error does not occur to the down stream side. According to the fifth aspect of the invention, when the normal data are transmitted to the downstream side by the selection unit, the process for correcting a code error is not required, and thus the data transmission efficiency can be improved.

According to the sixth aspect of the invention, normal data are held previously in a holding unit, and when a A-system code error detecting unit detects a code error of the data on the data transmission line, the normal data are transmitted to the data transmission line by a switching unit. According to the sixth aspect of the invention, the normal data are held in the holding unit, and when a code error occurs, the normal data are transmitted to the data transmission line, that is, recovery function is provided. As a result, it is not necessary to execute the process for correcting a code error, and thus the data transmission efficiency can be improved.

According to the seventh aspect of the invention, a comparison unit compares the normal data with the data where a code error occurred so that a portion where the code error occurred can be specified easily based on the comparison result.

Other objects and features of this invention will become apparent from the following description with reference to the accompanying drawings.

DESCRIPTION OF THE PREFERRED EMBODIMENTS

A code error monitor apparatus according to first through ninth embodiments of the present invention will be explained below with reference to the attached drawings.

Figure 1:
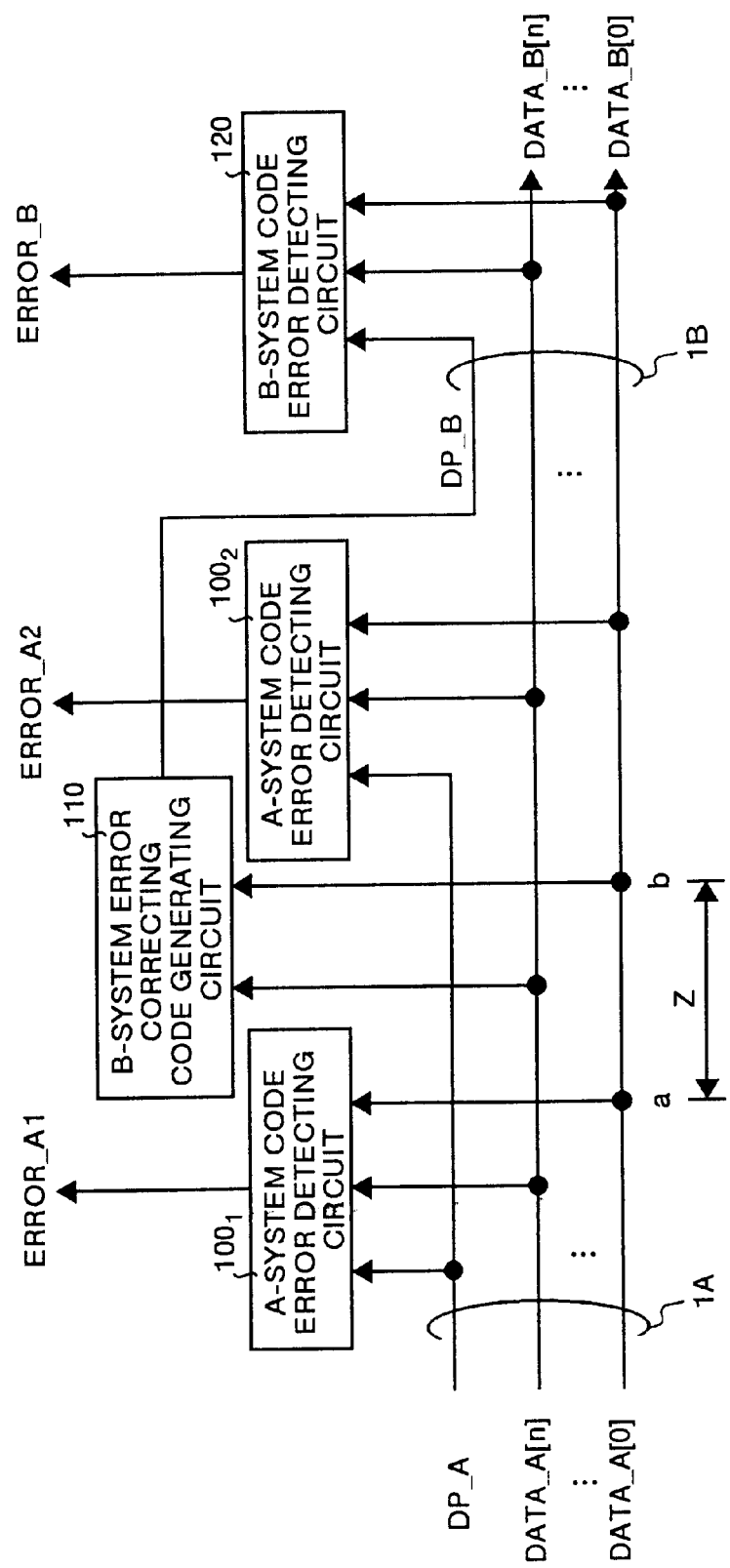
FIG. 1 is a constitutional diagram explaining the principles of a first embodiment of the present invention.
Figure 28:
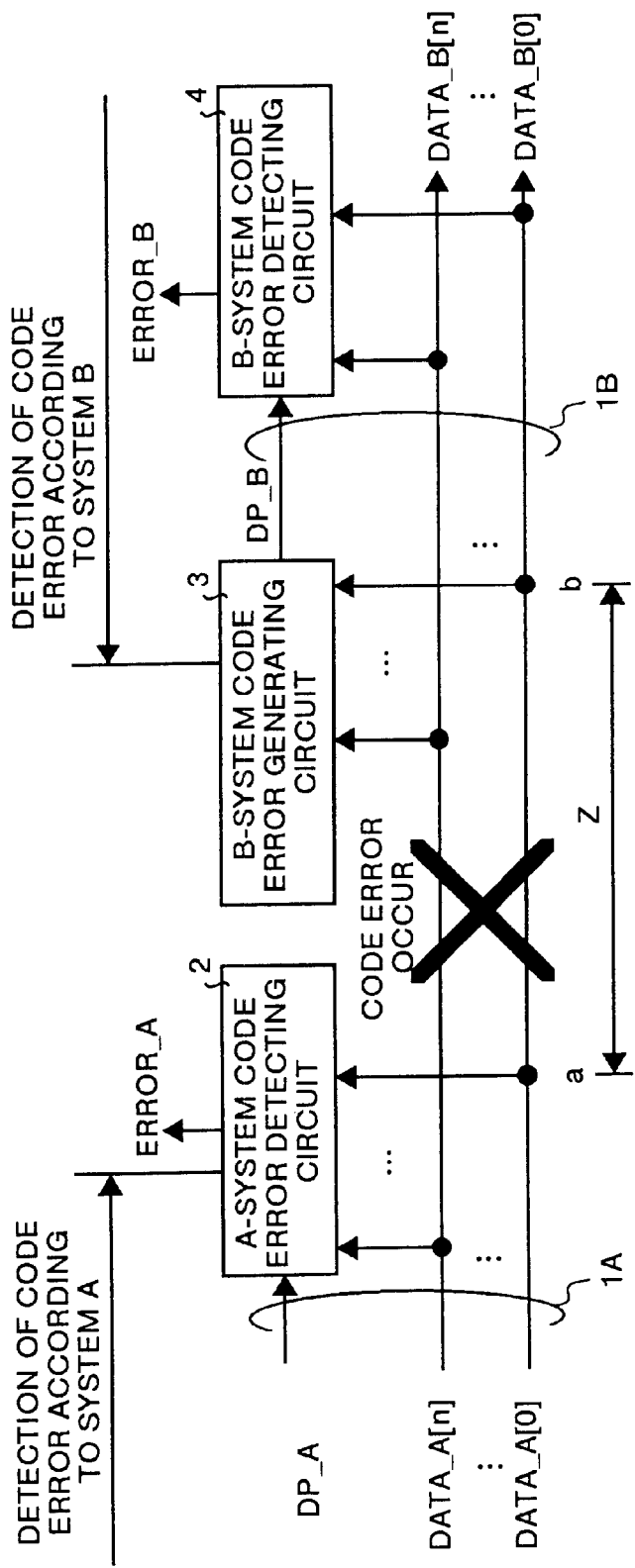
FIG. 28 is a block diagram showing a constitution of the main sections of a conventional code error monitor apparatus.

FIG. 1 is a constitutional diagram explaining the principles configuration of the of the first embodiment of the present invention. In FIG. 1, an A-system code error detecting circuit $100_1$, a B-system error correcting code generating circuit 110 and a B-system code error detecting circuit 120 correspond respectively to the A-system code error detecting circuit 2, the B-system error correcting code generating circuit 3 and the B-system code error detecting circuit 4 shown in FIG. 28. Moreover, in FIG. 1, an A-system code error detecting circuit $100_2$ is provided on a downstream side of a point 'b'.

Similarly to the A-system code error detecting circuit 2, the A-system code error detecting circuit $100_1$ detects a code error in a data bus 1A on the CPU side according to a system A (for example, odd parity check system). More specifically, when a number of "1" in an A-system bit string (bit data DATA__A[0] through bit data DATA__A[n] and an A-system error correcting code DP__A) is an even number then the A-system code error detecting circuit $100_1$ judges that a code error has occurred and outputs A-system code error detecting signal ERROR__A1 of "1" to a not shown CPU. On the other hand, when the number of "1" in the A-system bit string is an odd number then the A-system code error detecting circuit $100_1$ judges that a code error has not occurred in the data bus 1A on the CPU side and outputs an A-system code error detecting signal ERROR__A1 of "0" to the CPU.

The B-system error correcting code generating circuit 110 is provided on a downstream side of the A-system code error detecting circuit $100_1$ and similarly to the B-system error correcting code generating circuit 3, generates a B-system error correcting code DP__B of "1" or "0" so that the number of "1" in a bit string of (n+2) bits composed of the bit data DATA__A[0] through bit data DATA__A[n] and B-system error correcting code DP__B becomes an even number.

The A-system code error detecting circuit $100_2$ is provided on a downstream side of the B-system error correcting code generating circuit 110, and detects a code error of the A-system bit string passed through a portion Z according to the system A which is the same as the code detecting system of the A-system code error detecting circuit $100_1$. That is, the A-system code error detecting circuit $100_2$ detects a code error of the bit data DATA__A[0] through bit data DATA__A[n] to be used in the B-system error correcting code generating circuit 110. When a code error occurs, the A-system code error detecting circuit $100_2$ outputs an A-system code error detecting signal ERROR__A2 of "1" to the CPU. On the other hand, when a code error does not occur, the A-system code error detecting circuit $100_2$ outputs an A-system code error detecting signal ERROR__A2 of "0" to the CPU.

The B-system code error detecting circuit 120 is provided on a downstream side of the A-system code error detecting circuit $100_2$, and similarly to the B-system code error detecting circuit 4, detects a code error based on the number of "1" in a B-system bit string (bit data DATA__B[0] through bit data DATA__B[n] and B-system error correcting code DP__B) according to a system B (for example, even parity check system). When a code error occurs, the B-system code error detecting circuit 120 outputs a B-system code error detecting signal ERROR__B of "1" to the CPU. On the other hand, when a code error does not occur, the B-system code error detecting circuit 120 outputs a B-system code error detecting signal ERROR__B of "0" to the CPU.

In the above constitution, when a code error occurs in the portion Z then the B-system error correcting code generating circuit 110 generates an incorrect B-system error correcting code DP__B based on incorrect bit data DATA A[0] through bit data DATA__A[n]. However, the A-system code error detecting circuit $100_2$ positioned on the downstream side of the B-system error correcting code generating circuit 110 detects that a code error has occurred in the portion Z.

In this case, A-system code error detecting signal ERROR__A2 of "1" is output from the A-system code error detecting circuit $100_2$ to the CPU. As a result, the CPU executes an error correction such as retransmission of the bit data DATA__A[0] through bit data DATA__A[n] where a code error has occurred. According to the first embodiment, since the A-system code error detecting circuit $100_2$ is provided on the downstream side of the B-system error correcting code generating circuit 110, even if a code error occurs in the portion Z, the error correction is executed. As a result, the above-mentioned conventional problem is solved.

Figure 2:
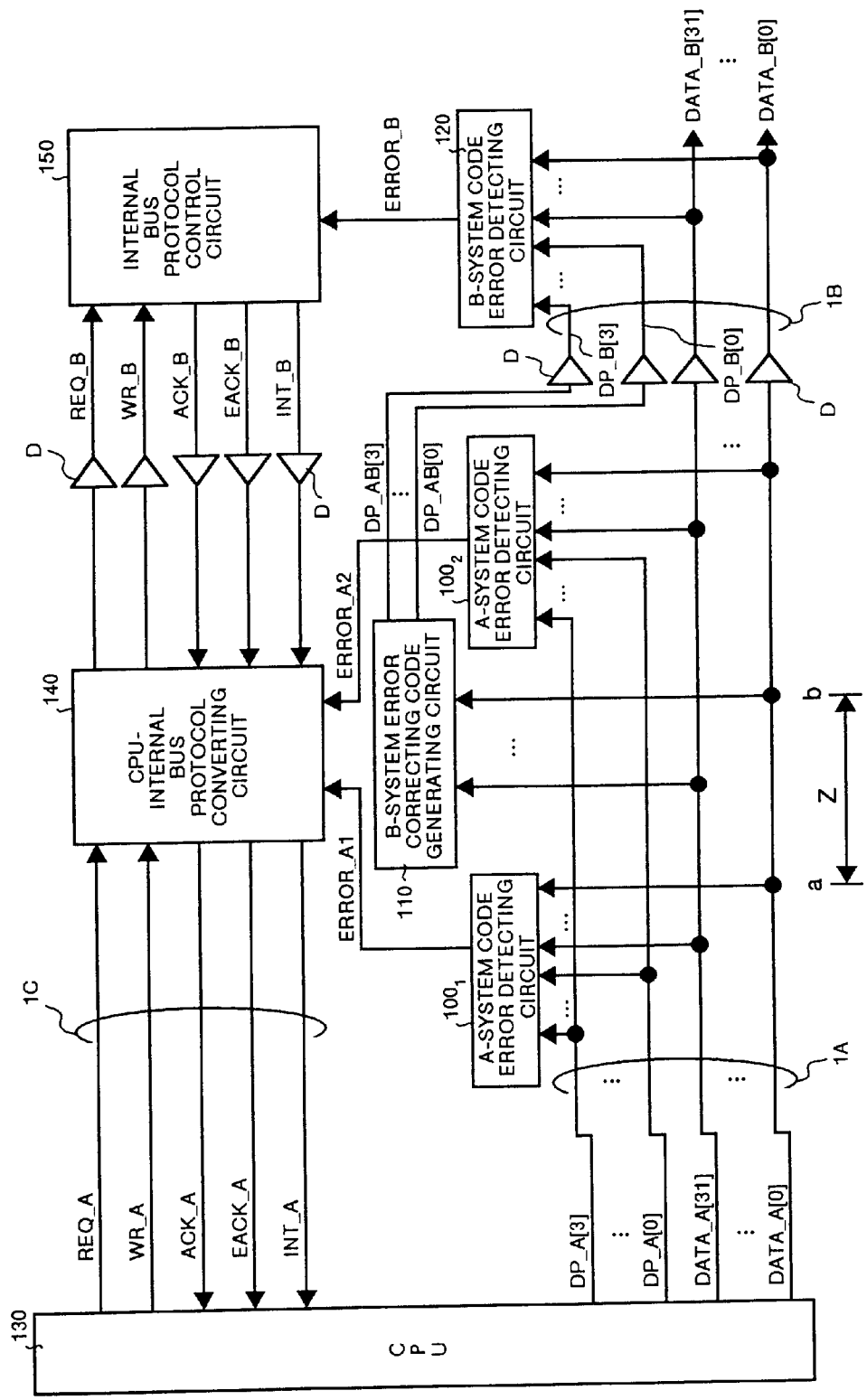
FIG. 2 is a block diagram showing a constitution of the first embodiment.

A concrete example of the first embodiment will be described below with reference to FIGS. 2 through 7. FIG. 2 is a block diagram showing a constitution of the first embodiment. In FIG. 2, the same reference numerals are given to sections corresponding to the sections in FIG. 1. The data bus 1A on the CPU side shown in FIG. 2 is a data bus for transmitting data of 32 bits, i.e., bit data DATA__A[0] through bit data DATA__A[31] and error correcting codes of 4 bits, i.e., A-system error correcting code DP__A[0] through A-system error correcting code DP__A[3].

The A-system error correcting code DP__A[0] is an error correcting code to be added to bit data DATA__A[0] through bit data DATA__A[7] for 1 byte. Moreover, the A-system error correcting code DP__A[1] is an error correcting code to be added to bit data DATA__A[8] through bit data DATA__A[15] for 1 byte. The A-system error correcting code DP__A[2] is an error correcting code to be added to bit data DATA__A[16] through bit data DATA__A[23] for 1 byte. Similarly, the A-system error correcting code DP__A[3] is an error correcting code to be added to bit data DATA__A[24] through bit data DATA__A[31] for 1 byte.

The A-system code error detecting circuit $100_1$ detects a code error in the data bus 1A on the CPU side based on the bit data DATA__A[0] through bit data DATA__A[31] and the A-system error correcting code DP__A[0] through A-system error correcting code DP__A[31] according to the system A. When a code error occurs in the A-system bit string (bit data DATA__A[0] through bit data DATA__A[31] and A-system error correcting code DP__A[0] through A-system error correcting code DP__A[3]), the A-system code error detecting circuit $100_1$ outputs an A-system code error detecting signal ERROR__A1 of "1". On the other hand, when a code error does not occur in the A-system bit string, the A-system code error detecting circuit $100_1$ outputs an A-system code error detecting signal ERROR__A1 of "0".

Figure 3:
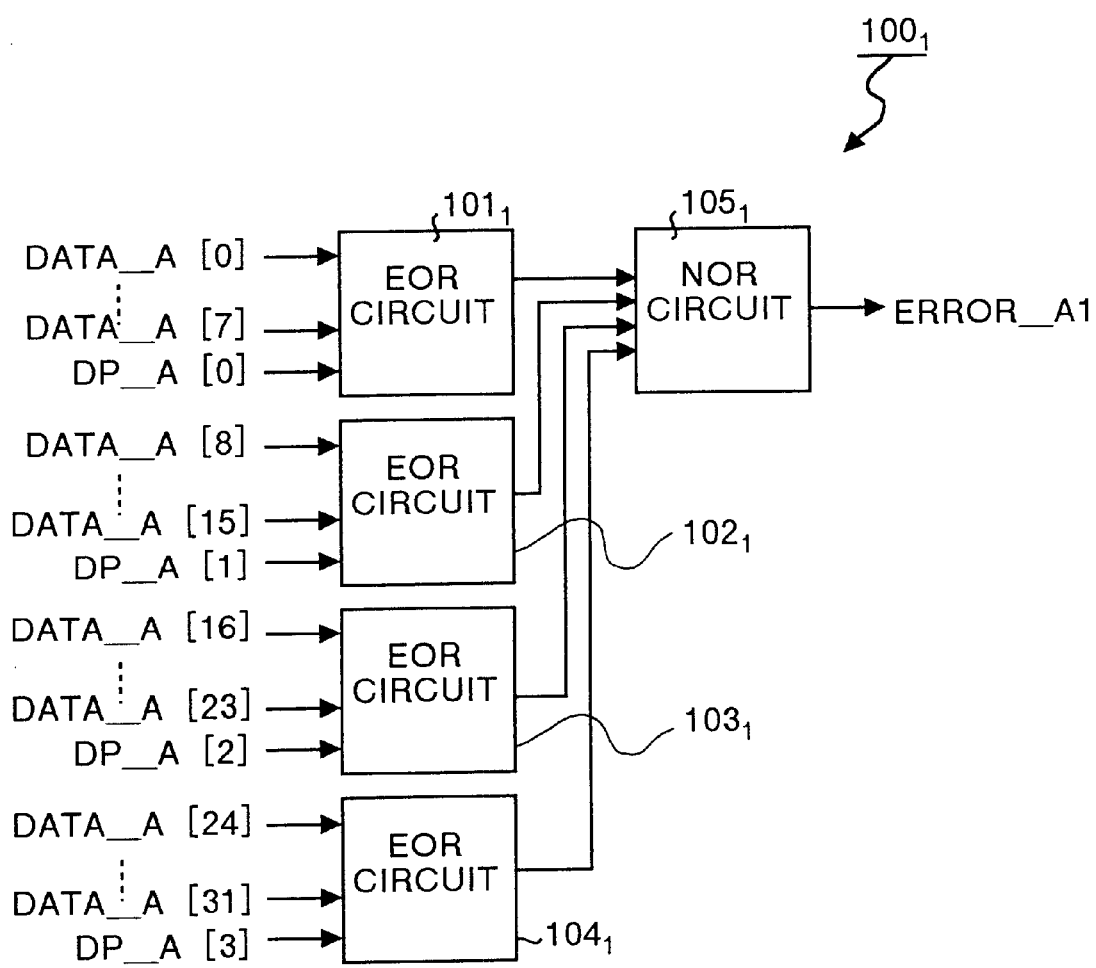
FIG. 3 is a diagram showing a configuration of the A-system code error detecting circuit $100_1$ shown in FIG. 2.

The A-system code error detecting circuit $100_1$ is composed of EOR (exclusive OR) circuits $101_1$ through $104_1$ and a NOR (NOT-OR) circuit $105_1$ as shown in FIG. 3. The bit data DATA__A[0] through bit data DATA__A[7] and the A-system error correcting code DP__A[0] are input into the EOR circuit $101_1$. The bit data DATA__A[8] through bit data DATA__A[15] and the A-system error correcting code DP__A[1] are input into the EOR circuit $102_1$.

Similarly, the bit data DATA__A[16] through bit data DATA__A[23] and the A-system error correcting code DP__A[2] are input into the EOR circuit $103_1$. The bit data DATA__A[24] through bit data DATA__A[31] and the A-system error correcting code DP__A[3] are input into the EOR circuit $104_1$. Moreover, output signals of the EOR circuits $101_1$ through $104_1$ are input into the NOR circuit $105_1$, and the A-system code error detecting signal ERROR__A1 (see FIG. 2) is output from the NOR circuit $105_1$.

As shown in FIG. 2, the B-system error correcting code generating circuit 110 generates B-system error correcting code DP__AB[0] through B-system error correcting code DP_AB[3] corresponding to data for 1 byte in the bit data DATA_A[0] through bit data DATA_A[31]. The B-system error correcting code DP_AB[0] is generated based on the bit data DATA_A[0] through bit data DATA_A[7] for 1 byte, and the B-system error correcting code DP_AB[1] is generated based on the bit data DATA_A[8] through bit data DATA_A[15] for 1 byte. Similarly, the B-system error correcting code DP_AB[2] is generated based on the bit data DATA_A[16] through bit data DATA_A[23] for 1 byte, and the B-system error correcting code DP_AB[3] is generated based on the bit data DATA_A[24] through bit data DATA_A[31] for 1 byte.

Figure 4:
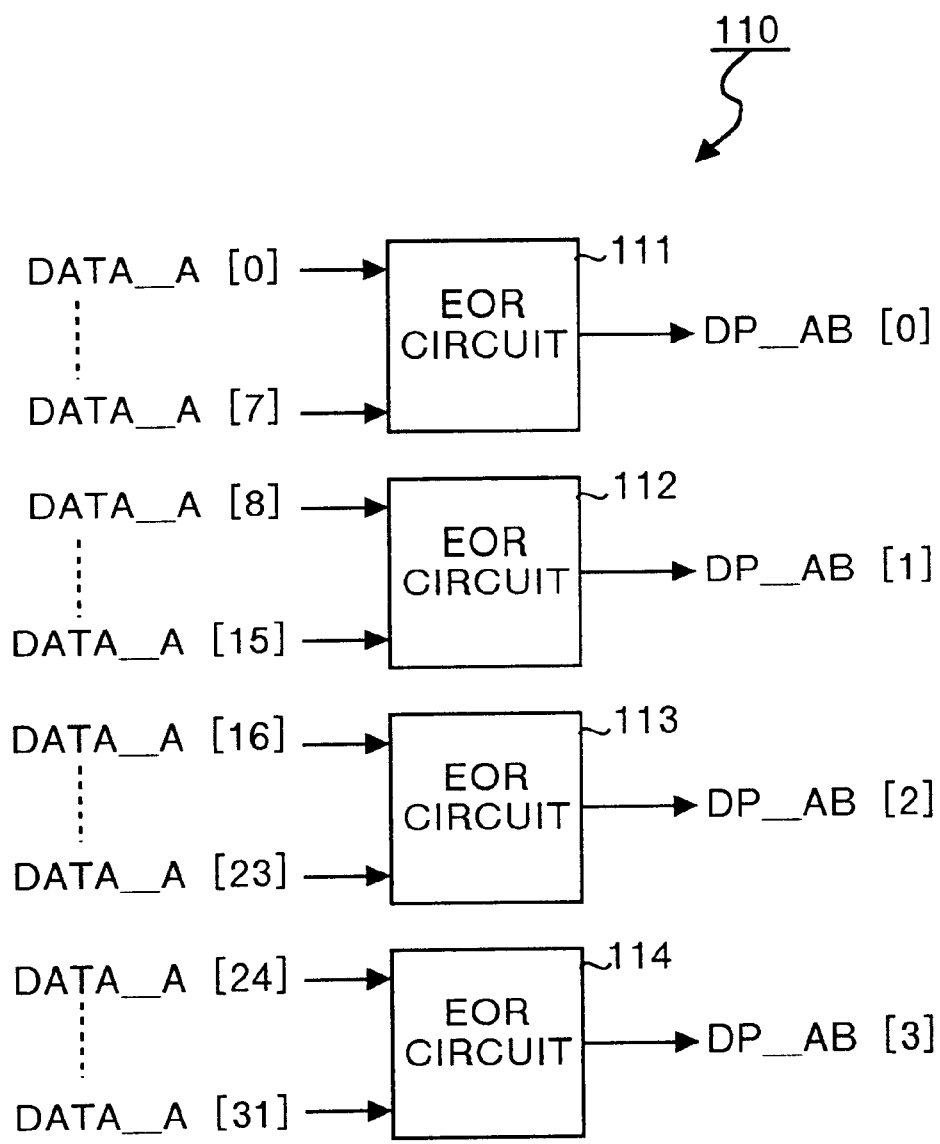
FIG. 4 is a diagram showing a configuration of the B-system error correcting code generating circuit 110 shown in FIG. 2.

The B-system error correcting code generating circuit 110 is composed of EOR circuits 111 through 114 as shown in FIG. 4. The EOR circuit 111 outputs an exclusive-OR result of the bit data DATA_A[0] through bit data DATA_A[7] as the B-system error correcting code DP_AB[0] (see FIG. 2). The EOR circuit 112 outputs an exclusive-OR result of the bit data DATA_A[8] through bit data DATA_A[15] as the B-system error correcting code DP_AB[1]. Similarly, the EOR circuit 113 outputs an exclusive-OR result of the bit data DATA_A[16] through bit data DATA_A[23] as the B-system error correcting code DP_AB[2] Moreover, the EOR circuit 114 outputs an exclusive-OR result of the bit data DATA_A[24] through bit data DATA_A[31] as the B-system error correcting code DP_AB[3].

As shown in FIG. 2, the A-system code error detecting circuit $100_2$ detects a code error based on the bit data DATA_A[0] through bit data DATA_A[31] and the A-system error correcting code DP_A[0] through A-system error correcting code DP_A[3] which were passed through the portion Z according to the system A. When a code error occurs in the A-system bit string, the A-system code error detecting circuit $100_2$ outputs an A-system code error detecting signal ERROR_A2 of "1", whereas when a code error does not occur in the A-system bit string, the A-system code error detecting circuit $100_2$ outputs an A-system code error detecting signal ERROR_A2 of "0".

Figure 6:
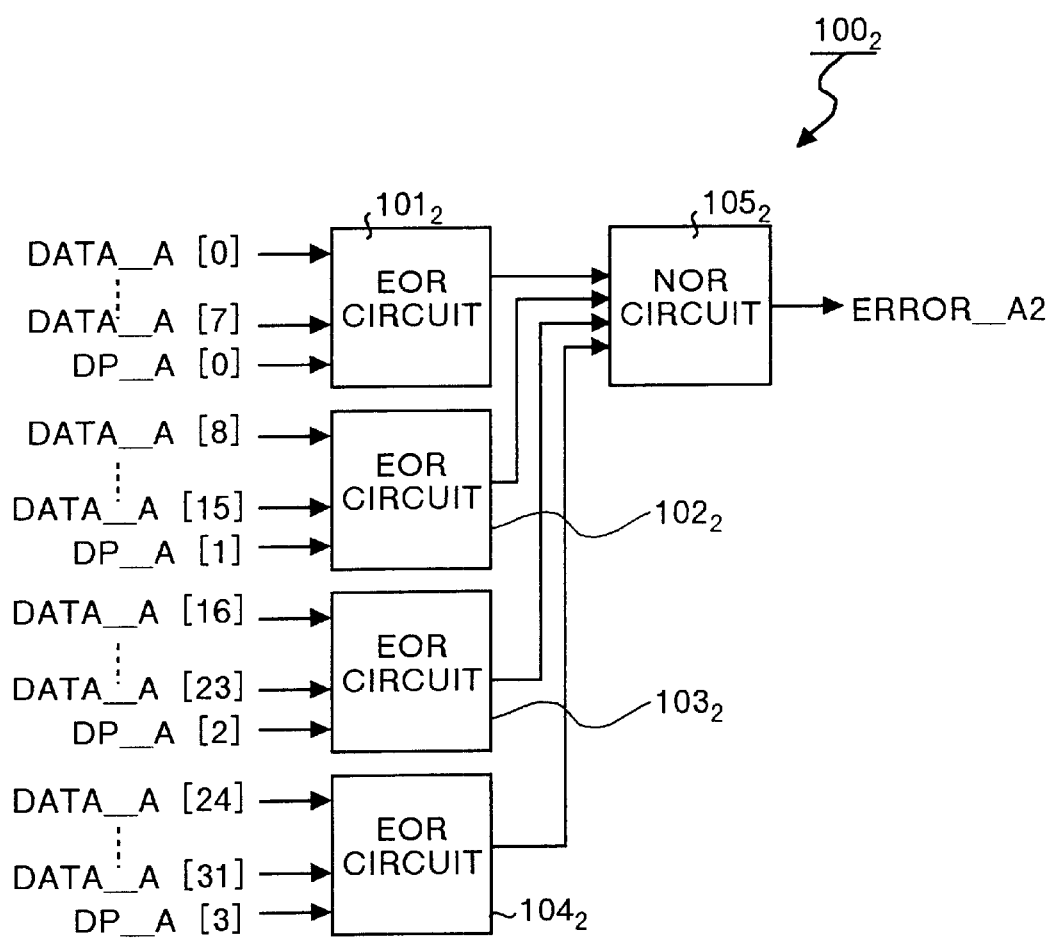
FIG. 6 is a diagram showing a configuration of the A-system code error detecting circuit $100_2$ shown in FIG. 2.

Similarly to the above-mentioned A-system code error detecting circuit $100_1$, the A-system code error detecting circuit $100_2$ is composed of EOR circuits $101_2$ through $104_2$ and an NOR (NOT-OR) circuit $105_2$ as shown in FIG. 6. The bit data DATA_A[0] through bit data DATA_A[7] and the A-system error correcting code DP_A[0] are input into the EOR circuit $101_2$. The bit data DATA_A[8] through bit data DATA_A[15] and the A-system error correcting code DP_A[1] are input into the EOR circuit $102_2$.

Similarly, the bit data DATA_A[16] through bit data DATA_A[23] and the A-system error correcting code DP_A[2] are input into the EOR circuit $103_2$. The bit data DATA_A[24] through bit data DATA_A[31] and the A-system error correcting code DP_A[3] are input into the EOR circuit $104_2$. Moreover, output signals of the EOR circuits $101_2$ through $104_2$ are input into the NOR circuit $105_2$, and the A-system code error detecting signal ERROR_A2 (see FIG. 2) is output from the NOR circuit $105_2$.

As shown in FIG. 2, the internal data bus 1B is a data bus for transmitting data of 32 bits, i.e., bit data DATA_B[0] through bit data DATA_B[31] and error correcting codes of 4 bits, i.e., B-system error correcting code DP_B[0] through B-system error correcting code DP_B[3]. The internal data bus 1B transmits the bit data DATA_A[0] through bit data DATA_A[31] transmitted on the data bus 1A on the CPU side as the bit data DATA_B[0] through bit data DATA_B[31] to the not shown apparatus (for example, memory) to be controlled.

The B-system error correcting codes DP_B[0] through DP_B[3] are codes obtained in such a manner that the B-system error correcting codes DP_AB[0] through DP_AB[3] are driven respectively by drivers D. The B-system error correcting code DP_B[0] is an error correcting code to be added to the bit data DATA_B[0] through bit data DATA_B[7] for 1 byte. Moreover, the B-system error correcting code DP_B[1] is an error correcting code to be added to the bit data DATA_B[8] through bit data DATA_B[15] for 1 byte. The B-system error correcting code DP_B[2] is an error correcting code to be added to the bit data DATA_B[16] through bit data DATA_B[23] for 1 byte. Similarly, the B-system error correcting code DP_B[3] is an error correcting code to be added to the bit data DATA_B[24] through bit data DATA_B[31] for 1 byte. Moreover, a plurality of the drivers D are provided in the vicinity of the internal data bus 1B.

The B-system code error detecting circuit 120 detects a code error in the internal data bus 1B based on the bit data DATA_B[0] through bit data DATA_B[31] and the B-system error correcting code DP_B[0] through B-system error correcting code DP_B[3] according to the system B (even parity check system) When a code error occurs in the B-system bit string (bit data DATA_B[0] through bit data DATA_B[31] and the B-system error correcting code DP_B[0] through B-system error correcting code DP_B[3]), the B-system code error detecting circuit 120 outputs an B-system code error detecting signal ERROR_B of "1". On the other hand, when a code error does not occur in the B-system bit string, the B-system code error detecting circuit 120 outputs a B-system code error detecting signal ERROR_B of "0".

Figure 5:
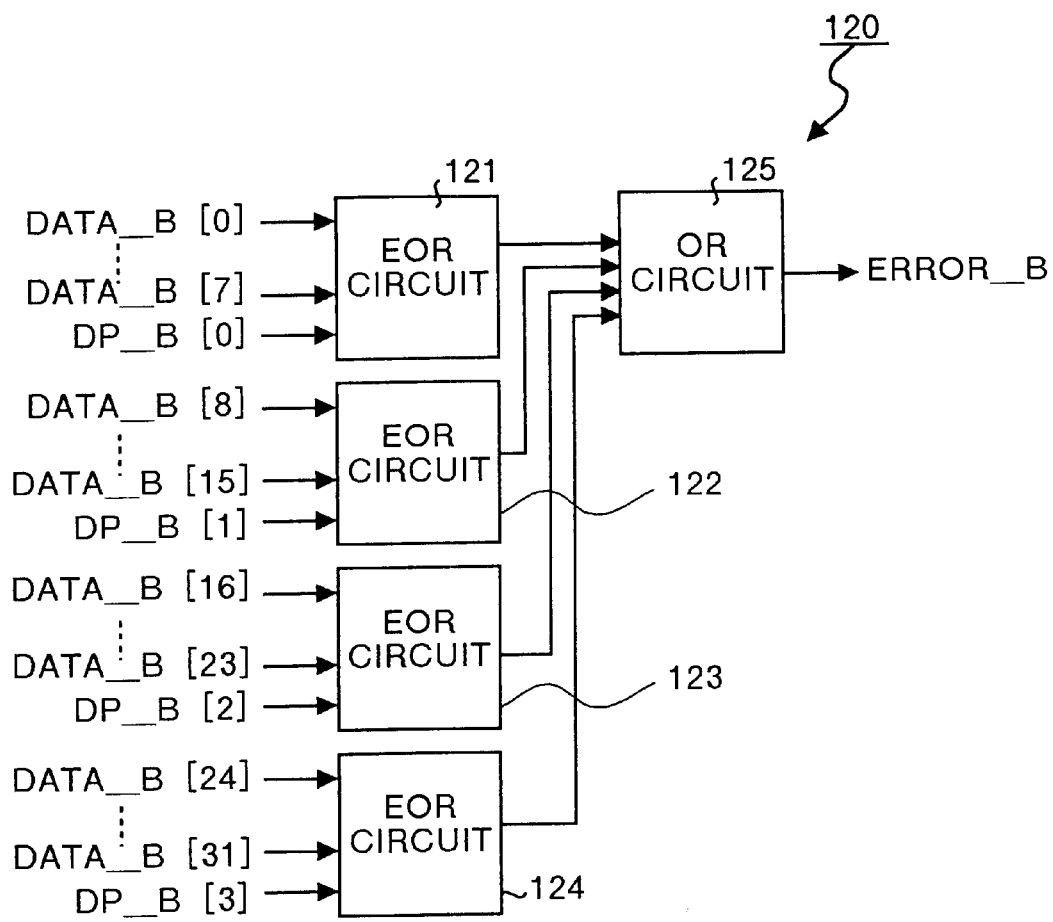
FIG. 5 is a diagram showing a configuration of the B-system code error detecting circuit 120 shown in FIG. 2.

Further, the B-system code error detecting circuit 120 is composed of EOR circuits 121 through 124 and an OR circuit 125 as shown in FIG. 5. The bit data DATA_B[0] through bit data DATA_B[7] and the B-system error correcting code DP_B[0] are input into the EOR circuit 121. The bit data DATA_B[8] through bit data DATA_B[15] and the B-system error correcting code DP_B[1] are input into the EOR circuit 122.

Similarly, the bit data DATA_B[16] through bit data DATA_B[23] and the B-system error correcting code DP_B[2] are input into the EOR circuit 123. The bit data DATA_B[24] through bit data DATA_B[31] and the B-system error correcting code DP_B[3] are input into the EOR circuit 124. Moreover, output signals of the EOR circuits 121 through 124 are input into the OR circuit 125, and a B-system code error detecting signal ERROR_B (see FIG. 2) is output from the OR circuit 125.

A CPU 130 controls the apparatus to be controlled via a control bus 1C, and outputs the bit data DATA_A[0] through bit data DATA_A[31] to the apparatus to be controlled via the data bus 1A on the CPU side and the internal data bus 1B. When a code error occurs in the data bus 1A on the CPU side and the internal data bus 1B then the CPU 130 executes a code error correction for retransmitting the bit data DATA_A[0] through bit data DATA_A[31] based on the A-system code error detecting signal ERROR_A1, the A-system code error detecting signal ERROR_A2 and the B-system code error detecting signal ERROR_B. Further, the CPU 130 generates A-system error correcting code DP_A[0] through A-system error correcting code DP_A[3].

A CPU-internal bus protocol converting circuit 140 is provided in the control bus 1C, and converts a protocol between a data communication protocol on the CPU 130 side and a data communication protocol on the internal data bus 1B side. That is, the CPU-internal bus protocol converting circuit 140 converts a request signal REQ_A and a write/read control signal WR_A which are output from the CPU 130 to an internal bus protocol control circuit 150 into a request signal REQ_B and a write/read control signal WR_B respectively. Moreover, the CPU-internal bus protocol converting circuit 140 converts a response signal ACK_B, a code error detecting signal EACK_B and an interrupt signal INT_B which are output from the internal bus protocol control circuit 150 to the CPU 130 into a response signal ACK_A, a code error detecting signal EACK_A and an interrupt signal INT_A respectively.

The request signal REQ_A is a signal for requesting an output of the response signal ACK_B from the apparatus to be controlled. The response signal ACK_B is a signal which means that the apparatus (memory) to be controlled which received the request signal REQ_B is in a controllable state. The code error detecting signal EACK_B is a signal which means that a code error is detected in the B-system code error detecting circuit 120. The code error detecting signal EACK_A is a signal which is obtained by converting the code error detecting signal EACK_B into a protocol on the CPU 130 side.

The code error detecting signal EACK_A is a signal which means that a code error is detected in the A-system code error detecting circuit $100_1$ or in the A-system code error detecting circuit $100_2$. The interrupt signal INT_B is a signal for interrupting a process which is being executed in the CPU 130. The write/read control signal WR_A is a signal for controlling the apparatus to be controlled as for reading or writing. The internal bus protocol control circuit 150 controls a protocol in the internal data bus 1B side. A plurality of drivers D are provided in the vicinity of the internal bus protocol control circuit 150.

Figure 7:
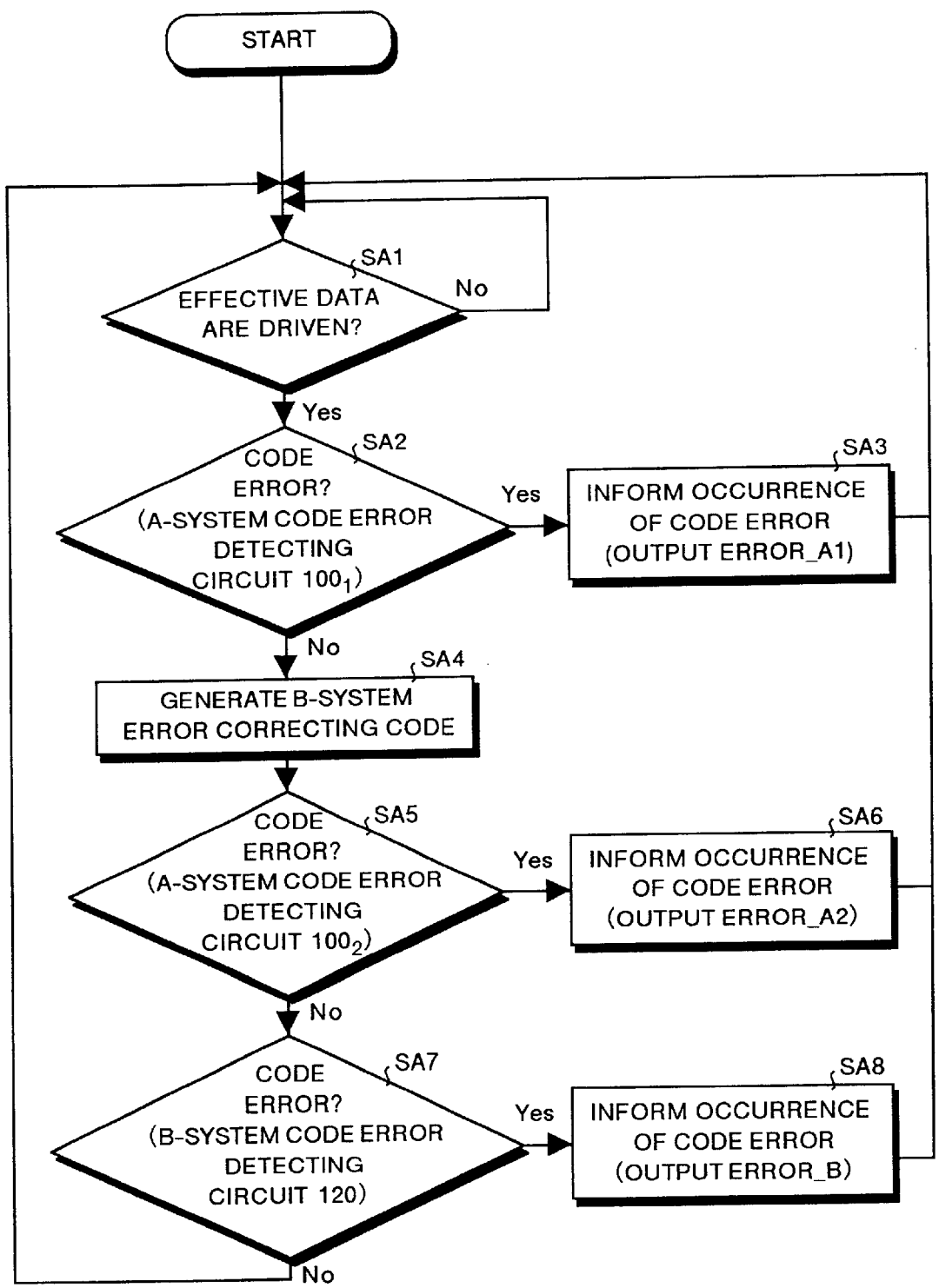
FIG. 7 is a flowchart explaining an operation of the first embodiment of the present invention.

Operation of the first embodiment will be described below with reference to the flowchart shown in FIG. 7. In step SA1 respective sections do not perform any operation, that is, are in wait state until effective data are driven to the data bus 1A on the CPU side by the CPU 130 (see FIG. 2). Here, the effective data are A-system bit string which is composed of the bit data DATA_A[0] through bit data DATA_A[31] and the A-system error correcting code DP_A[0] through A-system error correcting code DP_A[3]. When the A-system bit string is driven to the data bus 1A on the CPU side by the CPU 130, in step SA2 the A-system code error detecting circuit 100, detects as to whether or not a code error has occurred on the upstream side of the point 'a'.

When a code error is detected, in step SA3 the A-system code error detecting circuit $100_1$ outputs an A-system code error detecting signal ERROR_A1 of "1". As a result, the interrupt signal INT_A and the code error detecting signal EACK_A are output from the CPU-internal bus protocol converting circuit 140 to the CPU 130. The CPU 130 drives again the A-system bit string where the code error has occurred to the data bus 1A on the CPU side so as to execute the code error correction.

On the other hand, when a code error is not detected in step SA2, in step SA4 the B-system error correcting code generating circuit 110 generates B-system error correcting code DP_AB[0] through B-system error correcting code DP_AB[3]. In next step SA5 the A-system code error detecting circuit $100_2$ detects as to whether or not a code error has occurred in the portion Z. When a code error has occurred in the portion Z, the B-system error correcting code DP_AB[0] through B-system error correcting code DP_AB[3] generated by the B-system error correcting code generating circuit 110 are incorrect codes.

When the code error occurred in the portion Z is detected by the A-system code error detecting circuit $100_2$, in step SA6 the A-system code error detecting circuit $100_2$ outputs an A-system code error detecting signal ERROR_A2 of "1". As a result, the interrupt signal INT_A and the code error detecting signal EACK_A are output from the CPU-internal bus protocol converting circuit 140 to the CPU 130. The CPU 130 drives again the A-system bit string where the code error has occurred in the portion Z to the data bus 1A on the CPU side so as to execute the code error correction.

As mentioned above, when a code error occurs in the portion Z, the A-system code error detecting circuit $100_2$ detects the code error. For this reason, even if the B-system error correcting code DP_AB[0] through B-system error correcting code DP_AB[3] generated by the B-system error correcting code generating circuit 110 are incorrect, malfunction of the apparatus to be controlled is prevented by the code error correction.

On the other hand, when a code error is not detected by the A-system code error detecting circuit $100_2$ in step SA7 the B-system code error detecting circuit 120 detects as to whether or not a code error has occurred in the internal data bus 1B. When the B-system code error detecting circuit 120 detects a code error, in step SA8 the B-system code error detecting circuit 120 outputs a B-system code error detecting signal ERROR_B of "1". As a result, the interrupt signal INT_B and the code error detecting signal EACK_B are output from the internal bus protocol control circuit 150 to the CPU 130. The CPU 130 drives again the A-system bit string to the data bus 1A on the CPU side so as to execute the code error correction. Here, when a code error is not detected in step SA7, in step SA1 the wait state is maintained until next effective data are driven.

As mentioned above, according to the first embodiment, a code error in the portion Z is detected by the A-system code error detecting circuit $100_2$ positioned on the downstream side of the portion Z, and the detected result is given to the CPU 130. As a result, even if the B-system error correcting code DP_AB[0] through B-system error correcting code DP_AB[3] generated by the B-system error correcting code generating circuit 110 are incorrect the CPU 130 executes the code error correction.

According to the first embodiment, even when different code error detecting systems, i.e., the system A (odd parity check system) and system B (even parity check system) are adopted in the data bus composed of the data bus 1A on the CPU side and the internal data bus 1B, malfunction due to a code error can be prevented, and reliability and quality can be improved.

Figure 8:
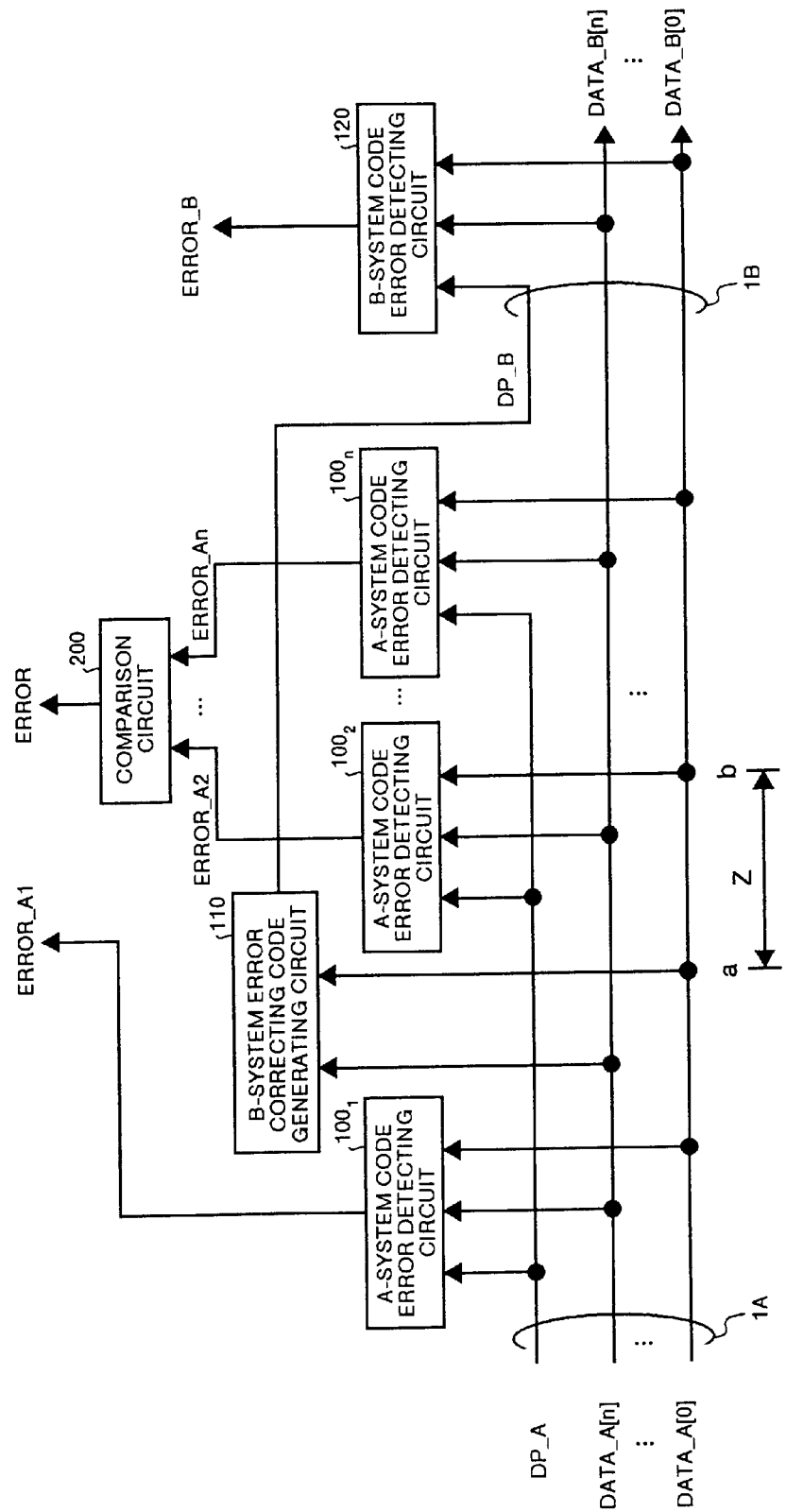
FIG. 8 is a block diagram showing a constitution of a second embodiment of the present invention.

In the above-mentioned first embodiment, as shown in FIG. 2, an example in which one A-system code error detecting circuit $100_2$ detects a code error in the portion Z. However, as shown in FIG. 8, a code error may be detected by a plurality (n−1) of A-system code error detecting circuits $100_2$ through $100_n$. Such a constitution will be detailed below as a second embodiment.

FIG. 8 is a block diagram showing a constitution of the second embodiment of the present invention. Same reference numerals are given to sections corresponding to the sections in FIG. 2. In FIG. 8, (n−1) number of A-system code error detecting circuits $100_2$ through $100_1$, are provided on the downstream side of the point 'a', and a comparison circuit 200 is newly provided. The CPU 130, the CPU-internal bus protocol converting circuit 140, the internal bus protocol control circuit 150 and the control bus IC shown in FIG. 2 are omitted from FIG. 8.

The A-system code error detecting circuits $100_2$ through $100_n$ shown in FIG. 8 have the same configuration, and they detect a code error in the downstream side of the point 'a' according to the system A (odd parity check system). Moreover, when detecting a code error, the A-system code error detecting circuits $100_2$ through $100_n$ output A-system code error detecting signal ERROR_A2 through A-system code error detecting signal ERROR_An of "1". On the other hand, when a code error is not detected, the A-system code error detecting circuits 1002 through $100_n$ outputs respectively A-system code error detecting signal ERROR_A2 through A-system code error detecting signal ERROR_An of "0".

The comparison circuit 200 compares a number of times that a code error is detected by the A-system code error detecting circuits $100_2$ through $100_n$ (hereinafter, referred to as a number of code error detected times) with a number of times that a code error is not detected (hereinafter, referred to as a normal number). More specifically, the comparison circuit 200 compares both the numbers in such a manner that a number of "1" in the A-system code error detecting signal ERROR_A2 through A-system code error detecting signal ERROR_An is used as the number of code error detected times and a number of "0" is used as the normal number.

Further, when a number of code error detected times is larger than the normal number, the comparison circuit 200 outputs A-system code error detecting signal ERROR of "1", which means that a code error is detected on the downstream side of the point 'a', to the CPU-internal bus protocol converting circuit 140 (see FIG. 2). On the other hand, when the number of code error detected times is smaller than the normal number, the comparison circuit 200 outputs A-system code error detecting signal ERROR of "0", which means that a code error is not detected on the downstream side of the point 'a', to the CPU-internal bus protocol converting circuit 140.

Figures 9A, 9B:
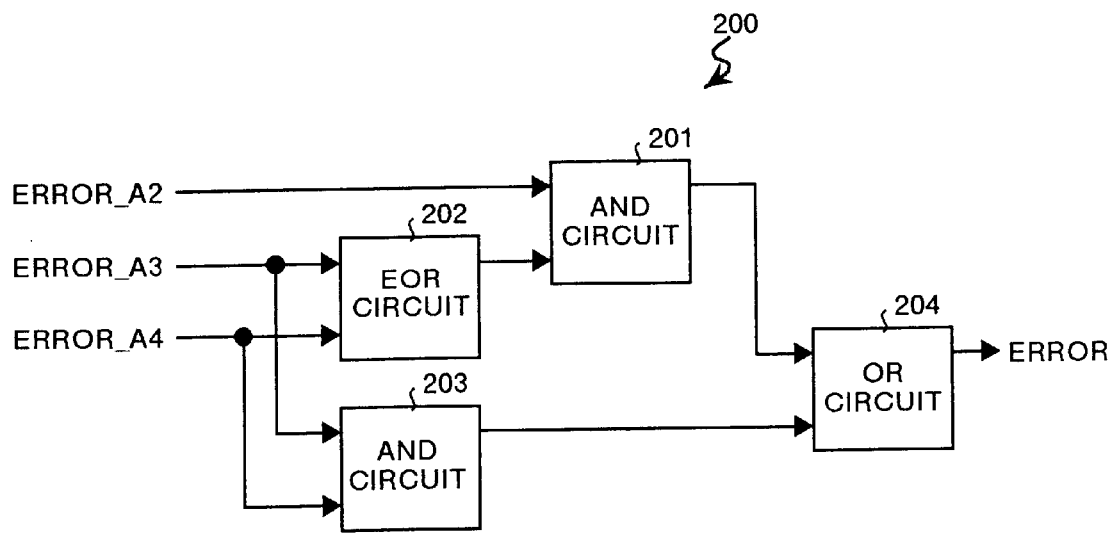
FIG. 9A is a diagram showing a configuration of the comparison circuit 200 shown in FIG. 8
FIG. 9B is a table of truth value.

The comparison circuit 200 is composed of an AND circuit 201, an EOR circuit 202, an AND circuit 203 and a OR circuit 204 as shown in FIG. 9A. FIG. 9A shows the case of the A-system code error detecting circuits $100_2$ through= $100_4$. Therefore, in FIG. 9A, the A-system code error detecting signal ERROR_An is shown as an A-system code error detecting signal ERROR_A4.

An A-system code error detecting signal ERROR_A3 and an A-system code error detecting signal ERROR_A4 are input respectively into the EOR circuit 202 and the AND circuit 203. An A-system code error detecting signal ERROR_A2 and an output signal of the EOR circuit 202 are input into the AND circuit 201. Moreover, an output signal of the AND circuit 201 and an output signal of the AND circuit 203 are input into the OR circuit 204. An A-system code error detecting signal ERROR is output from the OR circuit 204.

FIG. 9B is a table of truth value showing a relationship between input signals (A-system code error detecting signal ERROR_A2, A-system code error detecting signal ERROR_A3 and A-system code error detecting signal ERROR_A4) and output signals (A-system code error detecting signals ERROR) of the comparison circuit 200. As is clear from this diagram, the A-system code error detecting signal becomes "1" when a number of "1" (a number of code error detected times) is larger than a number of "0" (normal number) in the A-system code error detecting signal ERROR_A2, the A-system code error detecting signal ERROR_A3 and the A-system code error detecting signal ERROR_A4.

Operation of the second embodiment will be described below with reference to the flowchart shown in FIG. 10. However, a case is described in which the A-system code error detecting circuit $100_n$ (see FIG. 8) will be considered as the A-system code error detecting circuit $100_4$. In step SB1 in FIG. 10, the respective sections do not execute any operation, that is, in wait state until effective data are driven to the data bus 1A on the CPU side by the CPU 130 (see FIG. 2). The effective data are an A-system bit string composed of bit data DATA_A[0] through bit data DATA_A[n] and A-system error correcting codes DP_A. When the A-system bit string is driven to the data bus 1A on the CPU side by the CPU 130, a number of code error detected times NG is set to 0 in step SB2. In next step SB3 the A-system code error detecting circuit $100_1$ detects as to whether or not a code error has occurred on the upstream side of the point 'a' When a code error is detected, in step SB4 the A-system code error detecting circuit $100_1$ outputs an A-system code error detecting signal ERROR_A1 of "1". As a result, similarly to the first embodiment, the CPU 130 drives again the A-system bit string where the code error has occurred to the data bus 1A on the CPU side so as to execute the code error correction.

On the other hand, when a code error is not detected in step SB3, then in step SB5 the B-system error correcting code generating circuit 110 generates a B-system error correcting code DP_B. In next step SB6 the A-system code error detecting circuit $100_2$ detects as to whether or not a code error has occurred in the portion Z. When a code error has occurred in the portion Z, the B-system error correcting code DP_B generated by the B-system error correcting code generating circuit 110 is an incorrect code.

When the A-system code error detecting circuit $100_2$ detects the code error occurred in the portion Z, then in step SB7 the A-system code error detecting circuit $100_2$ outputs an A-system code error detecting signal ERROR_A2 of "1". At the same time the number of code error detected times NG is increased by 1 so that it becomes "1". On the other hand, when a code error is not detected in step SB6, then 1 is substituted in the normal number OK in step SB8.

In next step SB9 the A-system code error detecting circuit $100_3$ detects as to whether or not a code error has occurred in the portion between the A-system code error detecting circuit $100_2$ and the A-system code error detecting circuit $100_3$. When the A-system code error detecting circuit 100 detects the code error occurred in this portion, then in step SB10 the A-system code error detecting circuit $100_3$ outputs an A-system code error detecting signal ERROR_A3 of "1", and the number of code error detected times NG is increased by 1. On the other hand, when a code error is not detected in step SB9, then the normal number OK is increased by 1 in step SB11.

In next step SB12 the A-system code error detecting circuit $100_4$ detects as to whether or not a code error has occurred in a portion between the A-system code error detecting circuit $100_3$ and the A-system code error detecting circuit 1004. When the A-system code error detecting circuit $100_4$ detects a code error occurred in this portion, then in step SB13 the A-system code error detecting circuit $100_4$ outputs an A-system code error detecting signal ERROR_A4 of "1", and the number of code error detected times NG is increased by 1. On the other hand, when a code error is not detected in step SB12, then the normal number OK is increased by 1 in step SB14.

In next step SB15 the comparison circuit 200 compares the number of code error detected times NG with the normal number OK. When the number of code error detected times NG is larger than the normal number OK (see FIG. 9B), in step SB16 the comparison circuit 200 outputs an A-system code error detecting signal ERROR of "1". As a result, similarly to the first embodiment, the CPU 130 drives again the A-system bit string where the code error has occurred to the data bus 1A on the CPU side so as to execute the code error correction. Thus, even if the B-system error correcting code DP_B generated by the B-system error correcting code generating circuit 110 is incorrect, the code error correction prevents malfunction of the apparatus to be controlled.

On the other hand, when the number of code error detected times NG is smaller than the normal number OK in step SB15, in next step SB17 the B-system code error detecting circuit 120 detects as to whether or not a code error has occurred in the internal data bus 1B. When the B-system code error detecting circuit 120 detects a code error, in step SB18 the B-system code error detecting circuit 120 outputs a B-system code error detecting signal ERROR_B. As a result, similarly to the first embodiment, the CPU 130 drives again the A-system bit string to the data bus 1A on the CPU side so as to execute the code error correction. If a code error is not detected in step SB17, then in step SB1 the wait state is maintained until next effective data are driven.

As mentioned above, according to the second embodiment, since the CPU 130 is informed of a code error based on the detected results of the plural A-system code error detecting circuits $100_1$ through $100_n$ on the downstream side of the point 'a', the accuracy of code error detection can be improved further as compared to the first embodiment.

Figure 10:
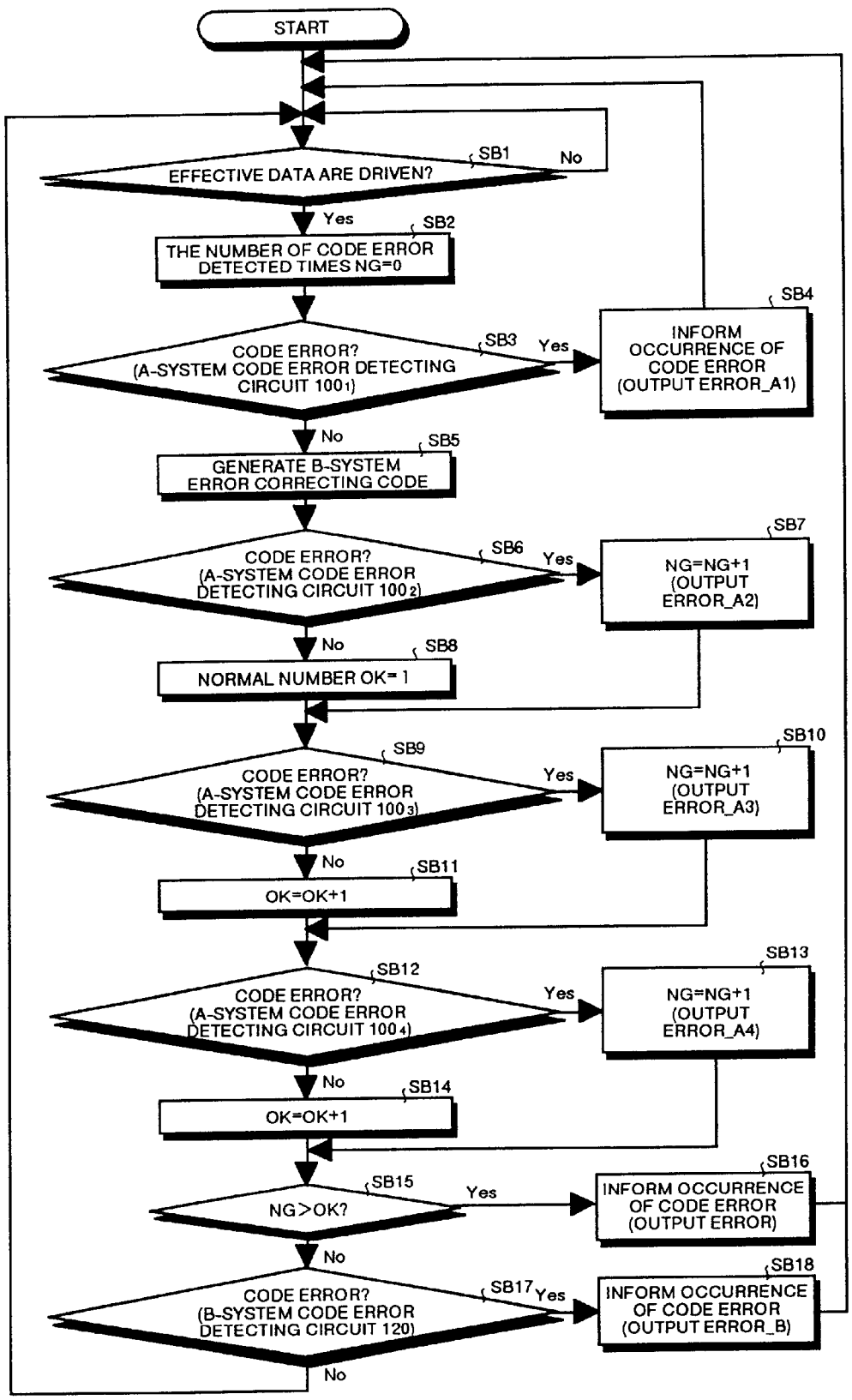
FIG. 10 is a flowchart explaining an operation of the second embodiment.

The above-mentioned second embodiment describes an example in which the values of the number of code error detected times NG and the normal number OK are compared with each other as shown in FIG. 10. However, the number of code error detected times NG may be compared with a preset threshold value. Such a constitution will be described in the following as a third embodiment.

Figure 11:
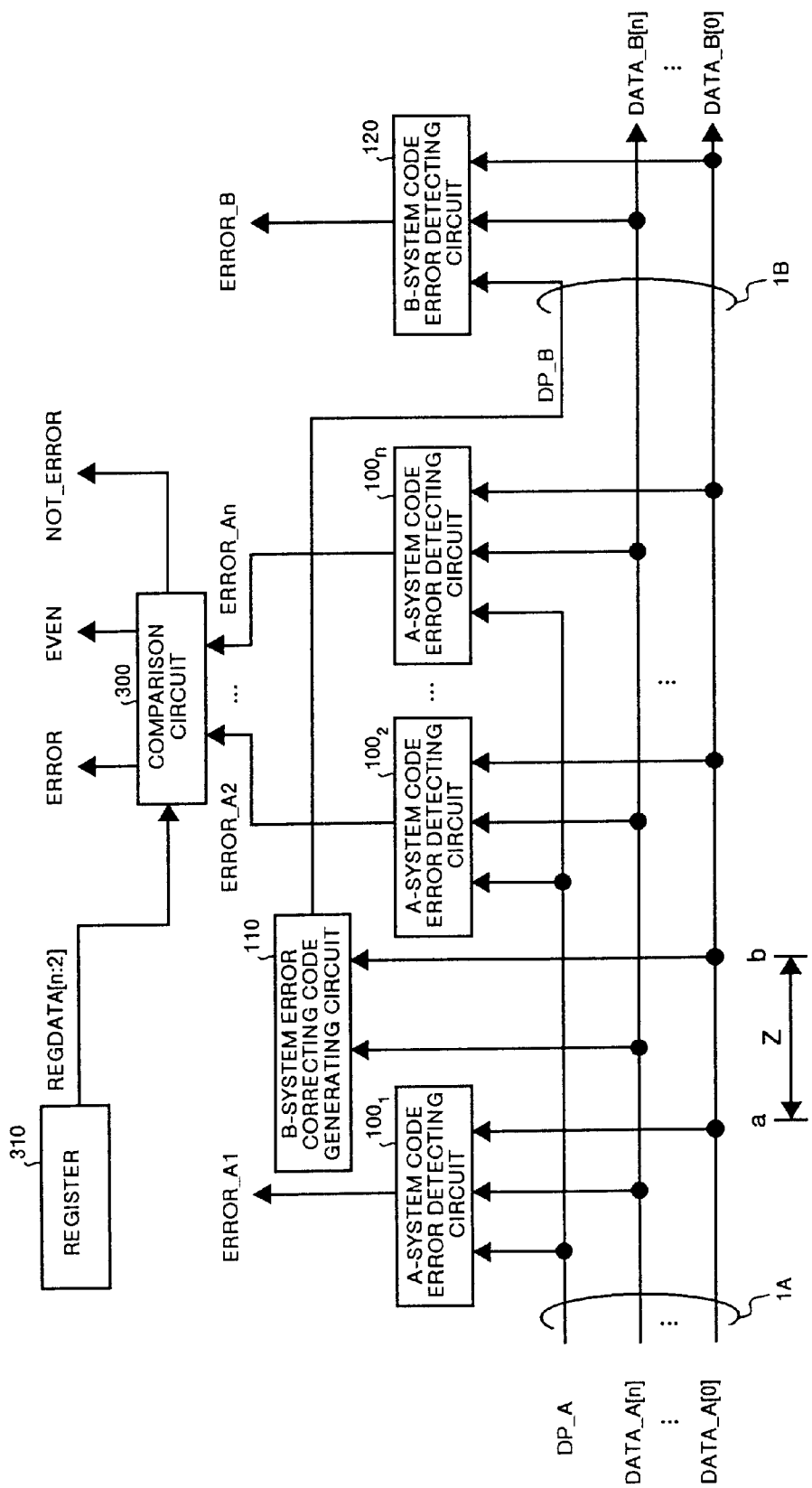
FIG. 11 is a block diagram showing a constitution of a third embodiment of the present invention.

FIG. 11 is a block diagram showing a constitution of the third embodiment of the present invention. Same reference numerals are given to sections corresponding to the sections shown in FIG. 8. In FIG. 11, a comparison circuit 300 is provided instead of the comparison circuit 200 shown in FIG. 8, and a register 310 is newly provided. The register 310 holds data of the threshold values, and outputs the data as threshold value data REGDATA[2] through threshold value data REGDATA[n] to the comparison circuit 300.

Figure 12:
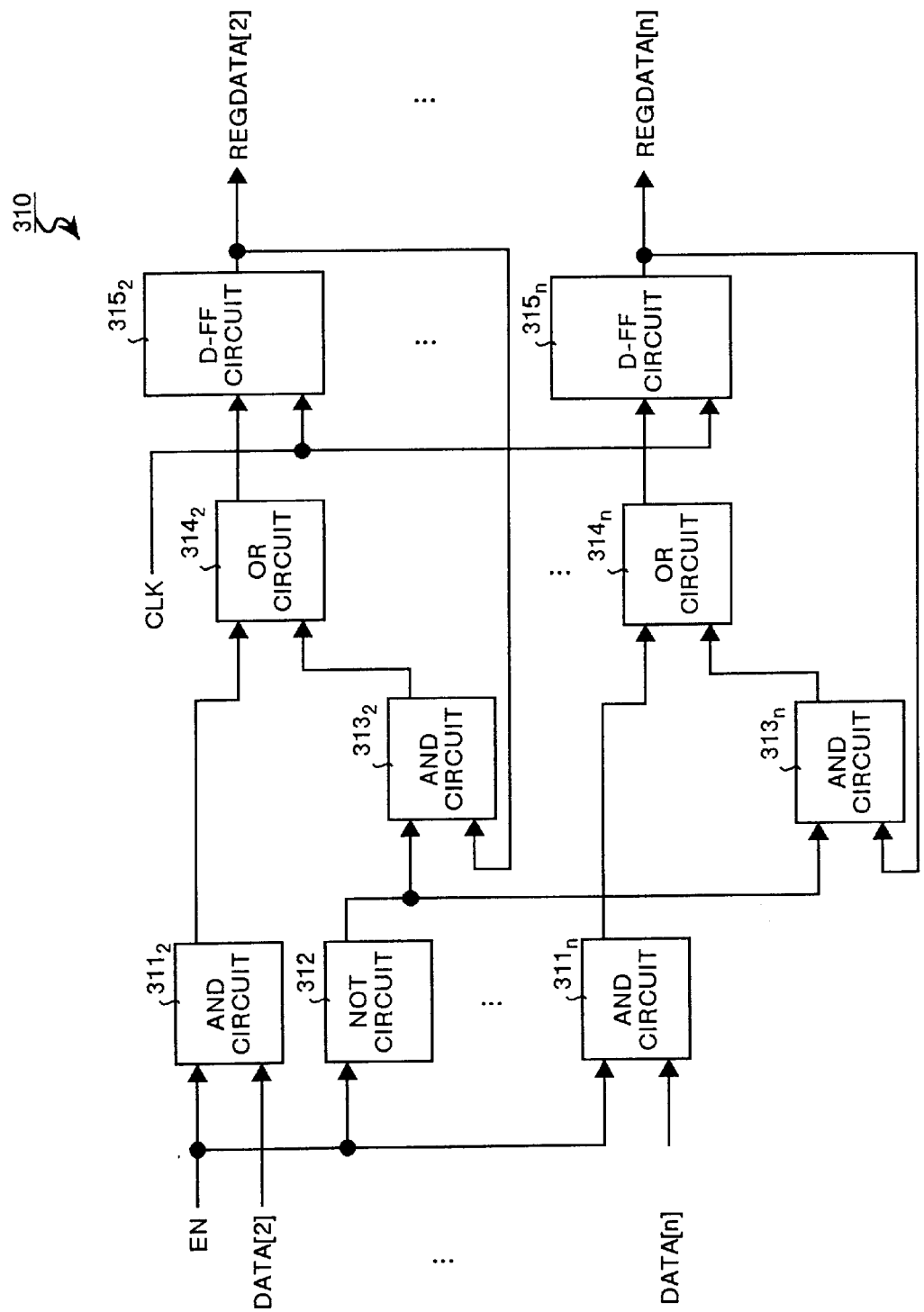
FIG. 12 is a diagram showing a constitution of the register 310 shown in FIG. 11.

The register 310 is composed of AND circuits $3112$ through $311_n$, a NOT circuit 312, AND circuits $3132$ through $313_n$, OR circuits $314_2$ through $314_n$, and D-FF (D-flip-flop) circuits $315_2$ through $315_n$, as shown in FIG. 12. Set signals EN and set data DATA[2] through set data DATA[n] are input respectively into the AND circuits $311_2$ through $311_n$. The set data DATA[2] through set data DATA[n] are data of threshold values which are held respectively by the D-FF circuits $3152$ through $315_n$.

In the D-FF circuits $315_2$ through $315_n$, when the set signal EN is "1", the set data DATA[2] through set data DATA[n] are held in a leading edge of a clock signal CLK, and the held data are output as threshold value data REGDATA[2] through threshold value data REGDATA[n].

The comparison circuit 300 compares the number of "1" (the number of code error detected times) in the A-system code error detecting signal ERROR_A2 through A-system code error detecting signal ERROR_An with the number of "1" (threshold value) in the threshold value data REGDATA[2] through threshold value data REGDATA[n]. Moreover, when the number of code error detected times is larger than the threshold value, the comparison circuit 300 outputs an A-system code error detecting signal ERROR, which means that a code error is detected on the downstream side of the point 'a', to the CPU-internal bus protocol converting circuit 140 (see FIG. 2).

On the contrary, when the threshold value is larger than the number of code error detected times, the comparison circuit 300 outputs an A-system code error non-detecting signal NOT_ERROR, which means that the code error is not detected, to the CPU-internal bus protocol converting circuit 140. Moreover, when the threshold value and the number of code error detected times are equal, the comparison circuit 300 outputs an equal value signal EVEN to the CPU-internal bus protocol converting circuit 140.

Figure 13:
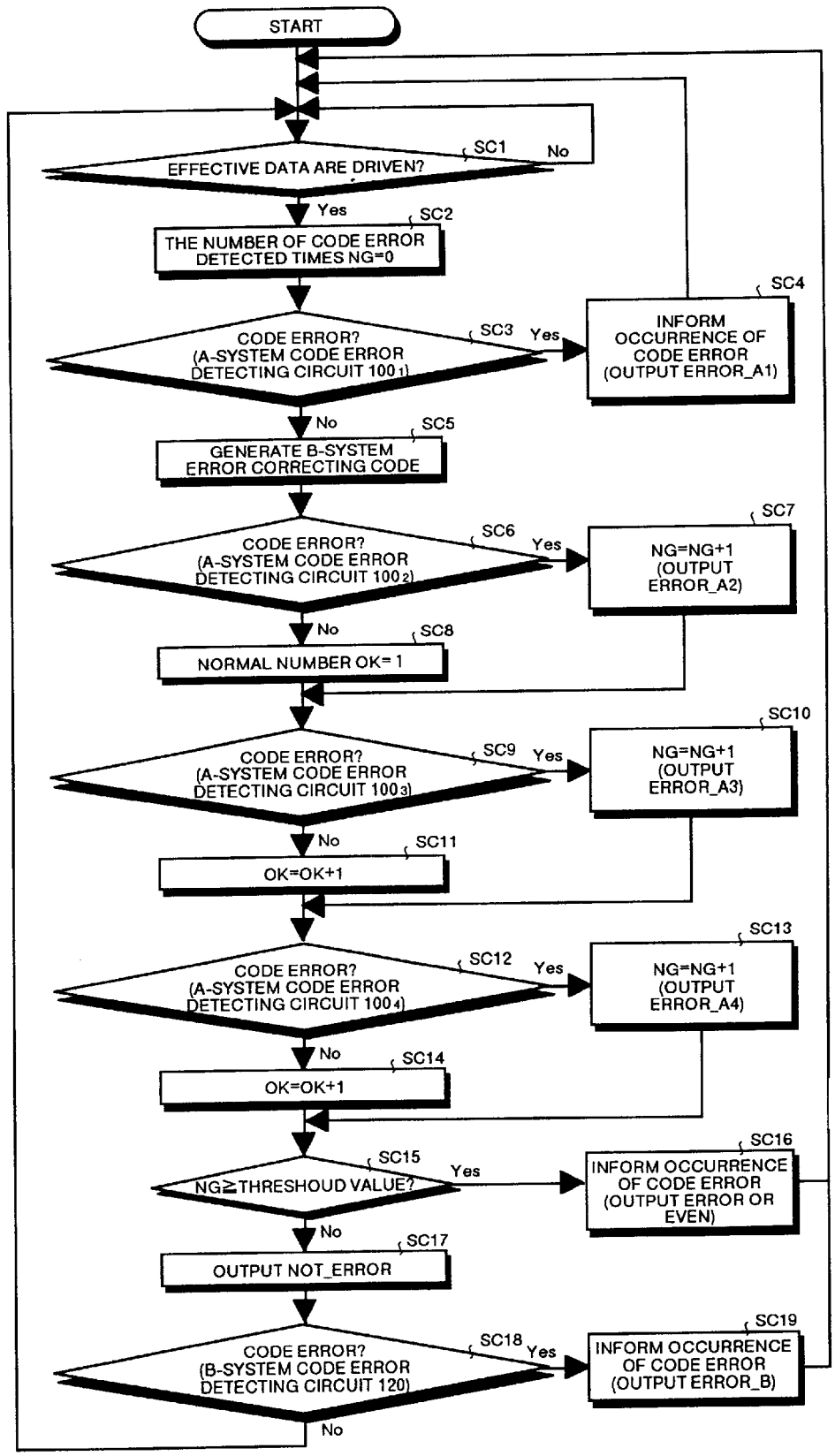
FIG. 13 is a flowchart explaining an operation of the third embodiment.

Operation of the third embodiment will be described below with reference to a flowchart shown in FIG. 13. In step SC1 shown in FIG. 13, the respective sections do not perform any operation, that is, are in wait state until effective data are driven to the data bus 1A on the CPU side by the CPU 130 (see FIG. 2). When the CPU 130 drives the A-system bit string to the data bus 1A on the CPU side, in step SC2 zero is substituted into the number of code error detected times NG. In the next step SC3 the A-system code error detecting circuit $100_1$ detects as to whether or not a code error has occurred on the upstream side of the point 'a'.

When a code error is detected, in step SC4 the A-system code error detecting circuit $100_1$ outputs an A-system code error detecting signal ERROR_A1 of "1". As a result, the aforementioned processes are performed and the error correction is executed. On the other hand, when a code error is not detected in step SC3, in step SC5 the B-system error correcting code generating circuit 110 generates a B-system error correcting code DP_B. In the next step SC6 the A-system code error detecting circuit $100_2$ detects as to whether or not a code error has occurred in the portion Z.

When the A-system code error detecting circuit $100_2$ detects a code error occurred in the portion Z, in step SC7 the A-system code error detecting circuit 100_outputs an A-system code error detecting signal ERROR_A2 of "1", and the number of code error detected times NG is increased by 1 so that it become "1". On the other hand, when a code error is not detected in step SC6, then 1 is substituted into the normal number OK in step SC8.

In the next step SC9 the A-system code error detecting circuit 1003 detects as to whether or not a code error has occurred in the portion between the A-system code error detecting circuit $100_2$ and the A-system code error detecting circuit $100_3$. When the A-system code error detecting circuit $100_3$ detects a code error occurred in this portion, in step SC10 the A-system code error detecting circuit $100_3$ outputs an A-system code error detecting signal ERROR_A3 of "1", and the number of code error detected times NG is increased by 1. On the other hand, when a code error is not detected in step SC9, the normal number OK is increased by 1 in step SC11.

In the next step SC12 the A-system code error detecting circuit $100_4$ detects as to whether or not a code error has occurred in the portion between the A-system code error detecting circuit $100_3$ and the A-system code error detecting circuit $100_4$. When the A-system code error detecting circuit $100_4$ detects a code error occurred in this portion, in step SC13 the A-system code error detecting circuit $100_4$ outputs an A-system code error detecting signal ERROR_A4 of "1", and the number of code error detected times NG is increased by 1. On the other hand, when a code error is not detected in step SC12, the normal number OK is increased by 1 at step SC14.

In the next step SC15 the comparison circuit 300 compares the number of code error detected times NG with a number of "1" (threshold value) in the threshold value data REGDATA[2] through threshold value data REGDATA[n]. When the number of code error detected times NG is larger than the threshold value, in step SC16 the comparison circuit 300 outputs an A-system code error detecting signal ERROR (or equal value signal EVEN). As a result, similarly to the first embodiment, the CPU 130 drives again the A-system bit string where a code error has occurred to the data bus 1A on the CPU side so as to execute the code error correction.

On the other hand, when the number of code error detected times NG is smaller than the normal value in step SC15, in the next step SC17 the comparison circuit 300 outputs an A-system code error non-detecting signal NOT_ERROR. In this case, the CPU 130 does not execute the code error detection. In the next step SC18 the B-system code error detecting circuit 120 detects as to whether or not a code error has occurs in the internal data bus 1B. When the B-system code error detecting circuit 120 detects a code error, in step SC19 the B-system code error detecting circuit 120 outputs a B-system code error detecting signal ERROR_B. As a result, similarly to the first embodiment, the CPU 130 executes the code error correction. When a code error is not detected in step SC18, the wait state is maintained at step SC1 until next effective data are driven.

As mentioned above, according to the third embodiment, the effects same as those in the second embodiment are obtained, and a the number of "1" (threshold value) in the threshold value data REGDATA[2] through threshold value data REGDATA[n] is set arbitrarily so that the accuracy of the code error detection accuracy can be freely changed by an user.

Figure 14:
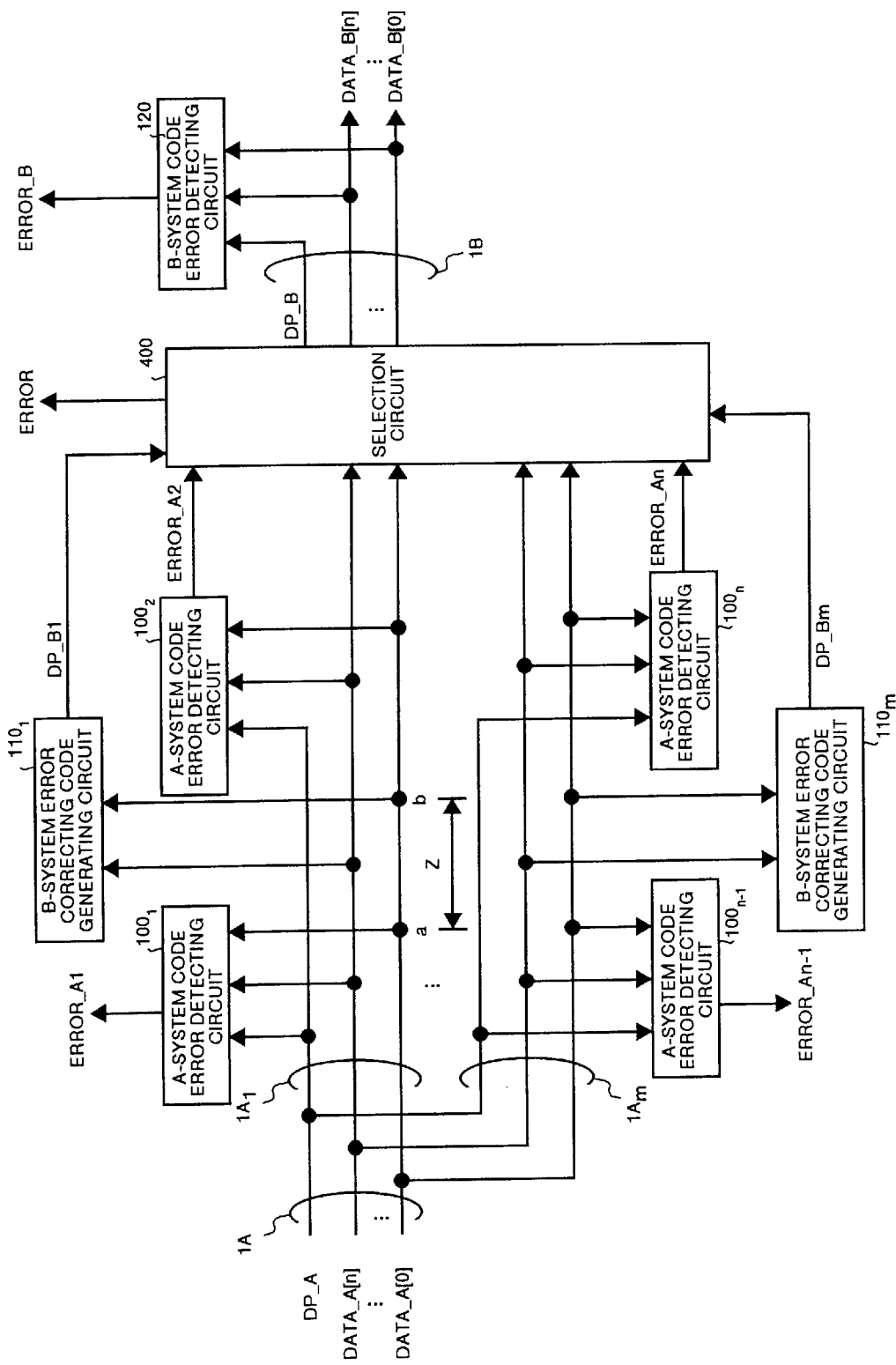
FIG. 14 is a block diagram showing a constitution of a fourth embodiment of the present invention.

FIG. 14 is a block diagram showing a constitution of a fourth embodiment of the present invention. Same reference numerals are given to sections corresponding to the sections in FIG. 1. The data bus 1A on the CPU side shown in FIG. 14 is branched into m in the vicinity of the internal data bus 1B. That is, the end of the data bus 1A on the CPU side is branched into m, i.e., data bus $1A_1$ on the CPU side through data bus $1A_m$ on the CPU side. The DATA buses on the CPU side $1A_1$ through $1A_m$ are provided with A-system code error detecting circuit 100$_1$ through A-system code error detecting circuit 100$_n$, and B-system error correcting code generating circuit 110$_1$ through B-system error correcting code generating circuit 110$_m$.

Thus, in the data bus $1A_1$ on the CPU side, similarly to FIG. 1, the A-system code error detecting circuit 100$_1$, the B-system error correcting code generating circuit 110$_1$ and the A-system code error detecting circuit 100$_2$ are provided.

Similarly in the data bus $1A_m$ on the CPU side, an A-system code error detecting circuit 100$_{n-1}$, the B-system error correcting code generating circuit 110$_m$ and the A-system code error detecting circuit 100$_n$ are provided.

The A-system code error detecting circuit 100$_1$ through A-system code error detecting circuit 100$_n$ output A-system code error detecting signal ERROR_A1 through A-system code error detecting signal ERROR_An respectively. The B-system error correcting code generating circuit 110$_1$ through B-system error correcting code generating circuit 110$_m$ have the configuration same as that of the B-system error correcting code generating circuit 110 (see FIG. 1), and generates B-system error correcting code DP_B1 through B-system error correcting code DP_Bm based on bit data DATA_A[0] through bit data DATA_A[n] in the data bus $1A_1$ on the CPU side through data bus $1A_n$ on the CPU side.

Figure 15:
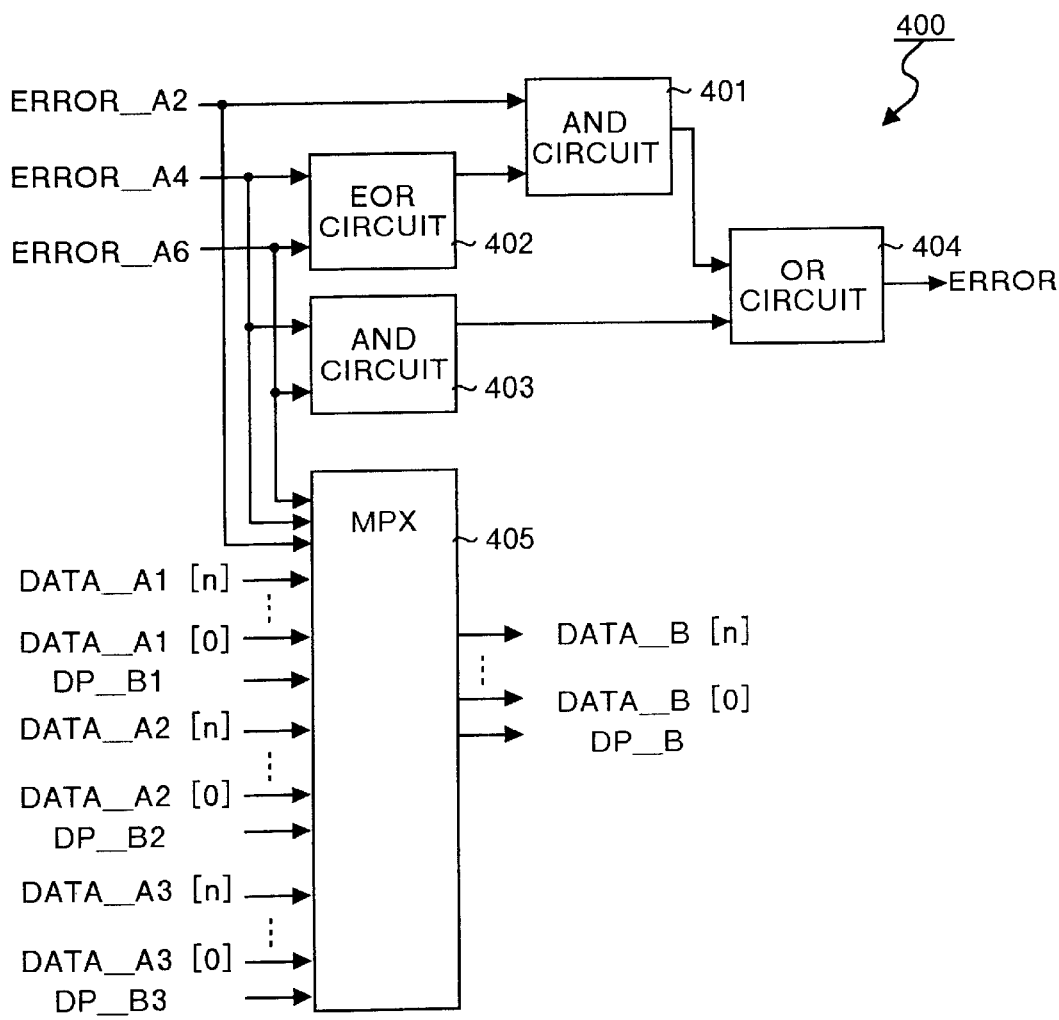
FIG. 15A is a diagram showing a configuration of a selection circuit 400 shown in FIG. 14
FIG. 15B is a table of truth value.

A selection circuit 400 is provided between the data bus $1A_1$ on the CPU side through data bus $1A_m$ on the CPU side and the internal data bus 1B. The selection circuit 400 selects specified bit data from bit data in the data bus $1A_1$ on the CPU side through data bus $1A_m$ on the CPU side according to a predetermined condition so as to output the selected data to the internal data bus 1B. As shown in FIG. 15A, the selection circuit 400 is composed of an AND circuit 401, an EOR circuit 402, an AND circuit 403, an OR circuit 404 and an MPX 405. The circuit composed of the AND circuit 401, EOR circuit 402, AND circuit 403 and OR circuit 404 has the configuration same as that of the circuit shown in FIG. 9A. FIG. 15A shows a case of A-system code error detecting circuit 100$_1$ through A-system code error detecting circuit 100$_6$.

An A-system code error detecting signal ERROR_4A and an system code error detecting signal ERROR_A6 are input respectively into the EOR circuit 402 and the AND circuit 403. An A-system code error detecting signal ERROR_A2 and an output signal of the EOR circuit 402 are input into the AND circuit 401. Moreover, an output signal of the AND circuit 401 and an output signal of the AND circuit 403 are input into the OR circuit 404. An A-system code error detecting signal ERROR is output from the OR circuit 404.

A table of truth value of the circuit composed of the AND circuit 401 and the like is the same as the table of truth value shown in FIG. 9B. However, in this case, in FIG. 9B, an A-system code error detecting signal ERROR_A3 is read as the A-system code error detecting signal ERROR_A4 and the A-system code error detecting signal ERROR_A4 is read as the A-system code error detecting signal ERROR_A6 (see FIG. 15A).

When a branched number m of the data bus $1A_m$ on the CPU side through the data bus $1A_m$ on the CPU side is 3, bit data DATA_A1[0] through bit data DATA_A1[n] and B-system error correcting code DP_B1 (see FIG. 14), and bit data DATA_A2[0] through bit data DATA_A2 [n] and B-system error correcting code DP_2B, and bit data DATA_A3[0] through bit data DATA_A3[n] and B-system error correcting code DP_B3 are input into the MPX (multiplexer) 405.

Here, the bit data DATA_A1[0] through bit data DATA_A1[n] are data on the data bus $1A_1$ on the CPU side, and the bit data DATA_A2[0] through bit data DATA_A2[n] are data on the data bus $1A_2$ on the CPU side. Similarly, the bit data DATA_A3[0] through bit data DATA_A3 [n] are data on the data bus $1A_m$ on the CPU side (m=3). Moreover, the A-system code error detecting signal ERROR_A2, the A-system code error detecting signal ERROR_A4 and the A-system code error detecting signal ERROR_A6 are input into the MPX 405.

The MPX 405 outputs bit data DATA_B[0] through bit data DATA_B [n] and B-system error correcting code DP_B according to the table of truth value shown in FIG. 15B. That is, when the A-system code error detecting signal ERROR A2 is "0", the MPX 405 outputs the bit data DATA_A1[0] through bit data DATA_A1[n] and B-system error correcting code DP_B1 as the bit data DATA_B[0] through bit data DATA_B[n] and B-system error correcting code DP_B to the internal data bus 1B. When the A-system code error detecting signal ERROR_A2 is "0", it means that the A-system code error detecting circuit 100$_2$ did not detect a code error.

In addition, as shown in FIG. 15B, when the A-system code error detecting signal ERROR_A2 is "1" and the A-system code error detecting signal ERROR_A4 is "0" and the A-system code error detecting signal ERROR_A6 is "0", the MPX 405 outputs the bit data DATA_A2[0] through bit data DATA_A2[n] and B-system error correcting code DP_B2 as the bit data DATA_B[0] through bit data DATA_B[n] and B-system error correcting code DP_B to the internal data bus 1B. That is, instead of the bit data DATA_A1[0] through bit data DATA_A1[n] where a code error has occurred and B-system error correcting code DP_B1, the normal bit data DATA_A2[0] through bit data DATA_A2[n] and B-system error correcting code DP_B2 are output to the internal data bus 1B.

Further, as shown in FIG. 15B, when the number of "1" in the A-system code error detecting signal ERROR_A2, A-system code error detecting signal ERROR_A4 and A-system code error detecting signal ERROR_A6 is larger than the number of "0" (in another case), the MPX 405 does not output any data. That is, the A-system code error detecting signal ERROR is output from the OR circuit 404, and the aforementioned code error correction is executed.

As mentioned above, in the fourth embodiment, when the number of "1" in the A-system code error detecting signal ERROR_A2, A-system code error detecting signal ERROR_A4 and A-system code error detecting signal ERROR_A6 is larger than the number of "0", the A-system code error detecting signal ERROR is output so that the CPU 130 (see FIG. 2) executes the code error correction. On the other hand, when the number of "1" is smaller than the number of "0", the MPX 405 outputs the normal data as the bit data DATA_B[0] through bit data DATA_B[n] bnd B-system error correcting code DP_B to the internal data bus 1B.

As mentioned above, according to the fourth embodiment, when a code error rate in the portion Z between the data bus $1A_1$ on the CPU side through data bus 1 on the CPU side which are branched into m is not more than a predetermined rate then the normal data are output into the internal data bus 1B. As a result, it is not necessary that the CPU 130 executes the code error correction. Therefore, according to the fourth embodiment, data transmission efficiency can be improved.

In the fourth embodiment described, as shown in FIGS. 15A and 15B, an example is explained in which the number of "1" and the number of "0" in the A-system code error detecting signal ERROR_A2, A-system code error detecting signal ERROR_A4 and A-system code error detecting signal ERROR_A6, in other words, the relationship between the number of code error detected times and the normal number is compared. However, the number of "1" (the number of code detected times) maybe compared with a preset threshold value. Such a constitution will be described below as a fifth embodiment.

Figure 16:
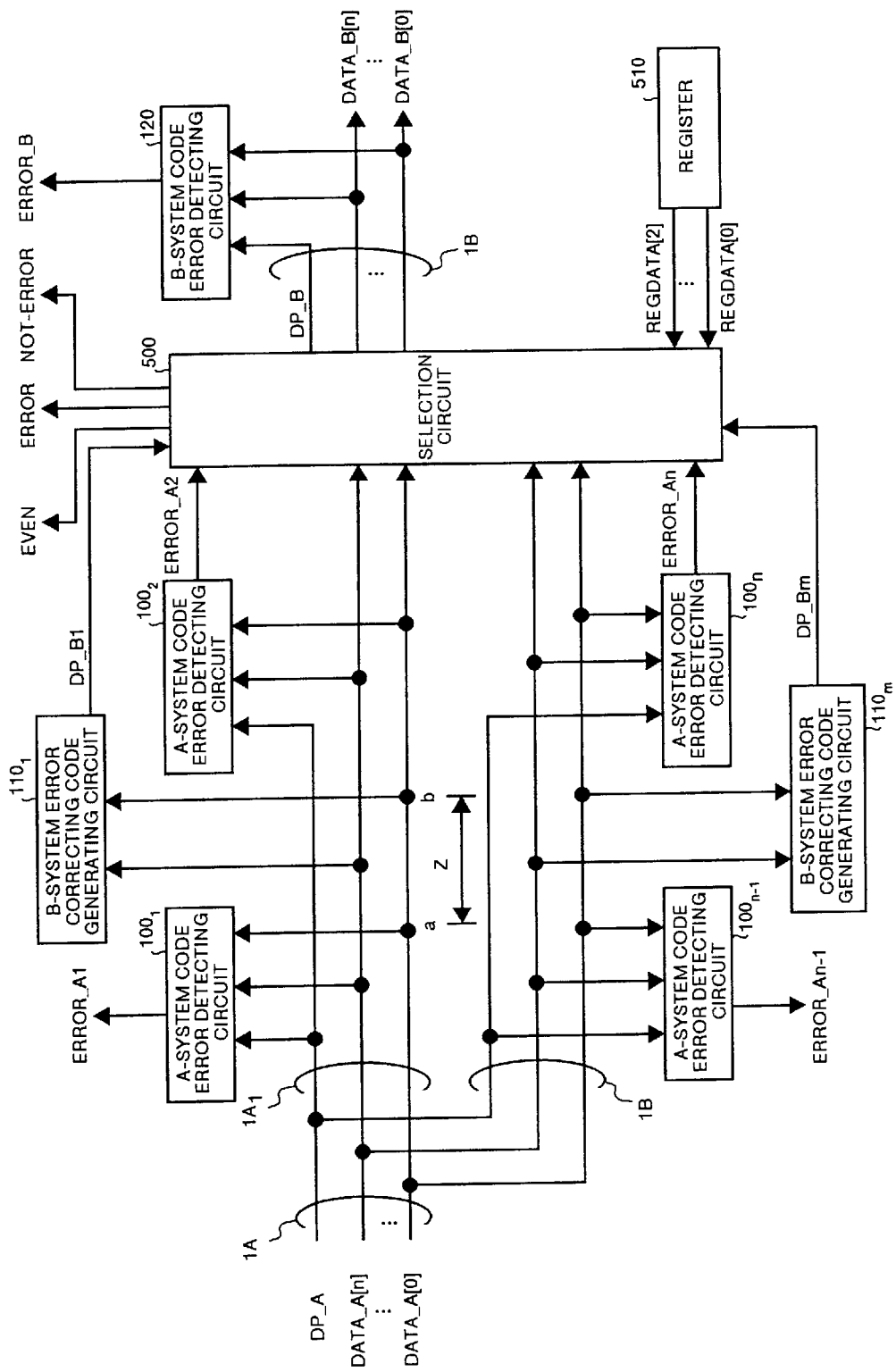
FIG. 16 is a block diagram showing a constitution of a fifth embodiment of the present invention.

FIG. 16 is a block diagram showing a constitution of the fifth embodiment of the present invention. Same reference numerals are given to sections corresponding to the sections in FIG. 14. In FIG. 16, a selection circuit 500 is provided instead of the selection circuit 400 shown in FIG. 14, and a register 510 is newly provided. The register 510 has the structure same as that of the register 310 shown in FIG. 12. The register 510 holds data of the threshold values, and outputs the data as threshold value data REGDATA[0] through threshold value data REGDATA[2] to the selection circuit 500.

Figure 17:
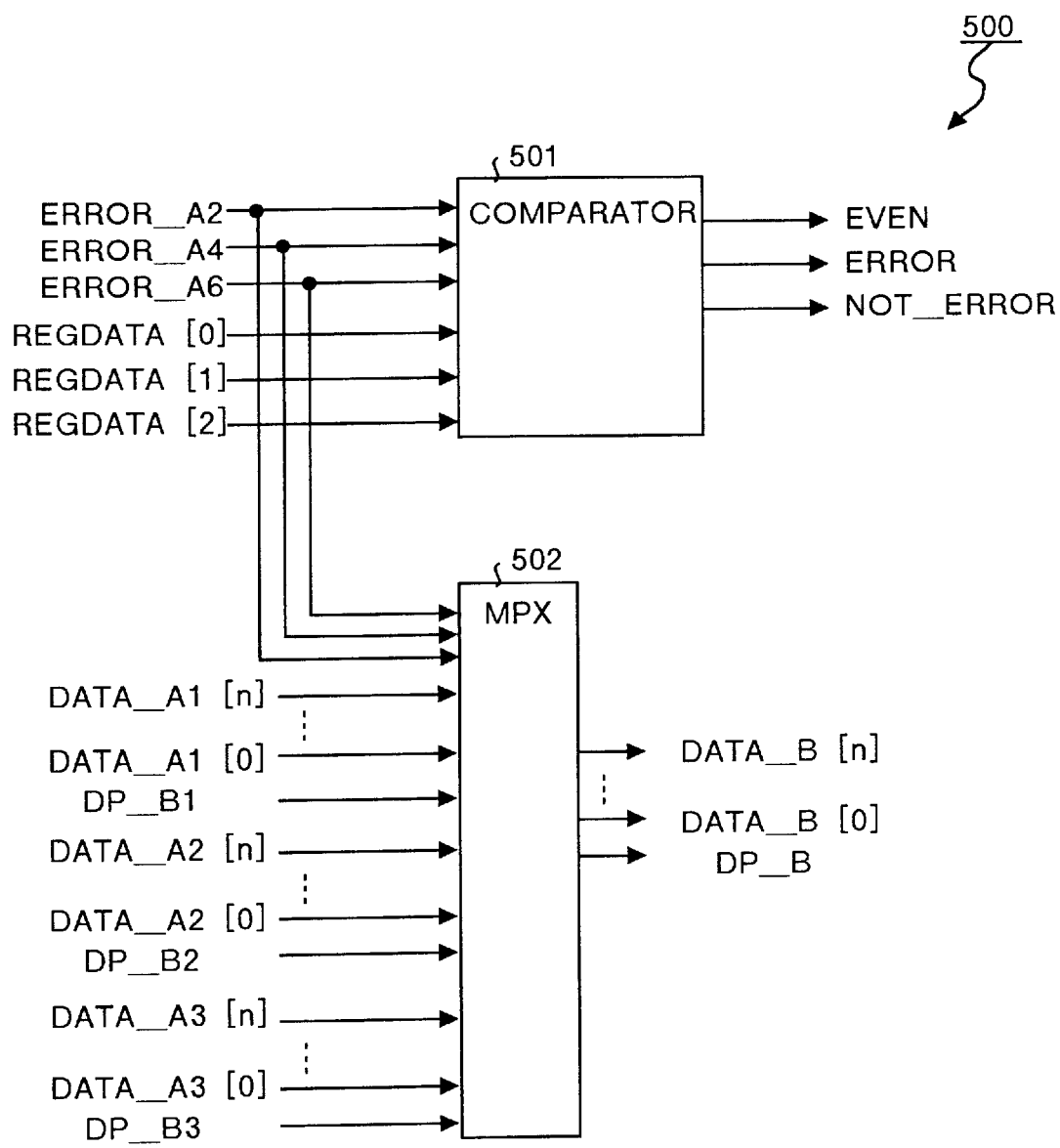
FIG. 17 is a diagram showing a configuration of the selection circuit 500 shown in FIG. 16.

As shown in FIG. 17, the selection circuit 500 is composed of a comparator 501 and an MPX 502. Similarly to the comparison circuit 300 (see FIG. 11), the comparator 501 compares the number of "1" (the number of code error detected times) in an A-system code error detecting signal ERROR_A2, A-system code error detecting signal ERROR_A4 and A-system code error detecting signal ERROR_A6 with the number of "1" (threshold value) in the threshold value data REGDATA[0] through threshold value data REGDATA[2].

When the number of code error detected times is larger than the threshold value, the comparator 501 outputs A-system code error detecting signal ERROR which means that a code error is detected in the data bus $1A_1$ on the CPU side through data bus $1A_m$ on the CPU side. On the contrary, when the threshold value is larger than the number of code error detected times, the comparator 501 outputs A-system code error non-detecting signal NOT_ERROR which means that the code error is not detected.

When the threshold value is equal to the number of code error detected times, the comparator 501 outputs an equal value signal EVEN. After A-system code error detecting signal ERROR, A-system code error non-detecting signal NOT_ERROR or equal value signal EVEN is output, the operation is the same as that in the third embodiment. The MPX 502 has the structure same as that of the MPX 405 (see FIG. 15A). Therefore, the MPX 502 is operated based on the table of truth value shown in FIG. 15B.

As mentioned above, according to the fifth embodiment, similarly to the fourth embodiment, when a code error rate in the portion Z between the data bus $1A_1$ on the CPU side through data bus $1A_m$ on the CPU side which are branched into m is not more than a predetermined rate, the normal data are output to the internal data bus 1B. As a result, it is not necessary that the CPU 130 executes the code error correction. Therefore, data transmission efficiency can be improved. In addition, similarly to the third embodiment, the number of "1" (threshold value) in the threshold value data REGDATA[0] through threshold value data REGDATA[2] is set arbitrarily so that the accuracy of the code error detection can be changed freely by a user.

Figure 18:
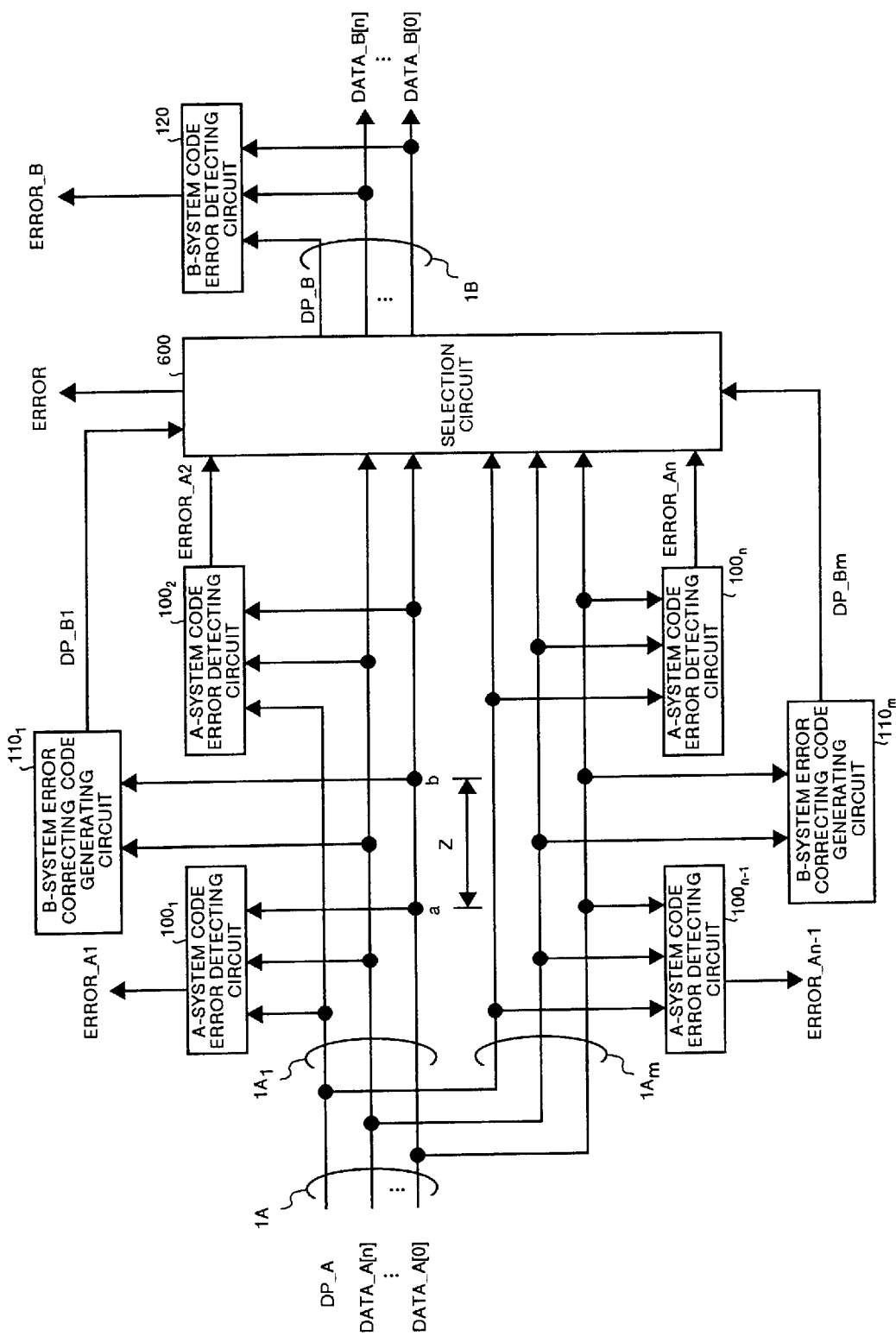
FIG. 18 is a block diagram showing a constitution of a sixth embodiment of the present invention.

FIG. 18 is a block diagram showing a constitution of the sixth embodiment of the present invention. Same reference numerals are given to sections corresponding to the respective sections in FIG. 14. In FIG. 18, a selection circuit 600 is provided instead of the selection circuit 400 shown in FIG. 14. The basic function of the selection circuit 600 is similar to the function of the selection circuit 400. However, the selection circuit 600 outputs A-system code error detecting signal ERROR, bit data DATA_B[0] through bit data DATA_B[n] and B-system error correcting code DP_B based on a result of comparing the data relating to the data bus $1A_1$ on the CPU side through data bus $1A_m$ on the CPU side.

Figure 19:
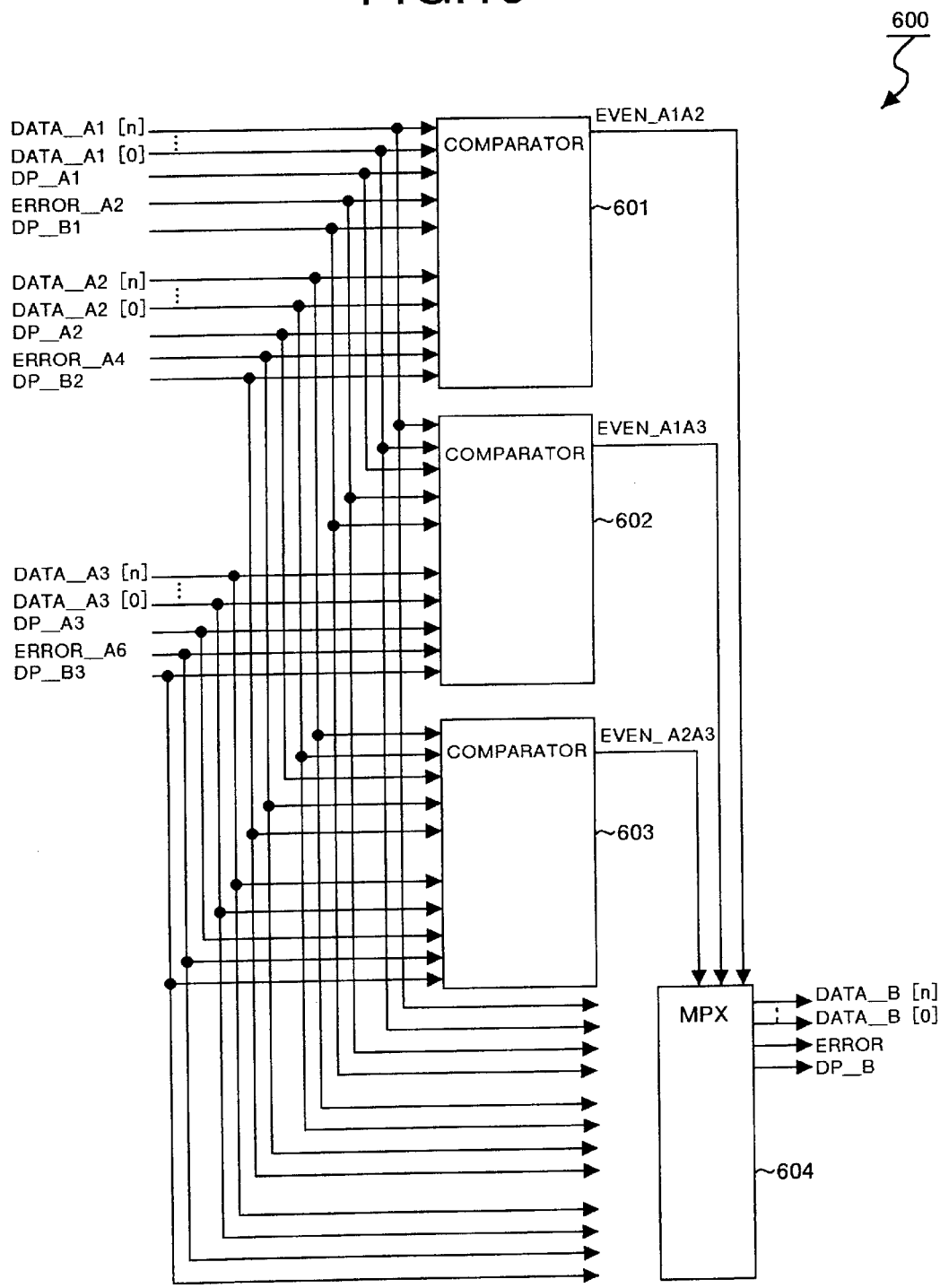
FIG. 19 is a diagram showing a configuration of the selection circuit 600 shown in FIG. 18.

As shown in FIG. 19, the selection circuit 600 is composed of comparators 601, 602 and 603 and an MPX 604. Same reference numerals are given to signal data which are identical to the signal data shown in FIG. 15. A-system error correcting code DP_A1 through A-system error correcting code DP_A3 shown in FIG. 19 are A-system error correcting codes DP_A (see FIG. 18) transmitted through the data bus $1A_1$ on the CPU side through data bus $1A_m$ on the CPU side.

Various signal data relating to the data bus $1A_1$ on the CPU side and various signal data relating to the data bus $1A_2$ on the CPU side (not shown) are input into the comparator 601. More specifically, the bit data DATA_A1[0] through bit data DATA_A1[n], the A-system error correcting code DP_A1, the A-system code error detecting signal ERROR_A2 and the B-system error correcting code DP_B1, and the bit data DATA_A2[0] through bit data DATA_A2 [n], the A-system error correcting code DP_A2, the A-system code error detecting signal ERROR_A4 and the B-system error correcting code DP_B2 are input into the comparator 601.

The comparator 601 compares the signal data relating to the data bus $1A_1$ on the CPU side with the signal data relating to the data bus $1A_2$ on the CPU side (not shown). When all the data coincides with each other, the comparator 601 outputs a comparison result signal EVEN_A1A2 of "1". Moreover, when even one of the data does not coincide with the other data, the comparator 601 outputs a comparison result signal EVEN_A1A2 of "0". Here, as for the above comparison, the comparator 601 compares the bit data DATA_A1[0] through bit data DATA_A1[n] with the bit data DATA_A2[0] through bit data DATA_A2[n] and compares the A-system error correcting code DP_A1 with the A-system error correcting code DP_A2. Further, the comparator 601 compares the A-system code error detecting signal ERROR_A2 with the A-system code error detecting signal ERROR_A4, and compares the B-system error correcting code DP_B1 with the B-system error correcting code DP_B2.

The various signal data relating to the data bus $1A_1$ on the CPU side and various signal data relating to the data bus $1A_m$ on the CPU side (in this case, m=3) are input into the comparator 602. More specifically, the bit data DATA_A1 [0] through bit data DATA_A1[n], the A-system error correcting code DP_A1, the A-system code error detecting signal ERROR_A2 and B-system error correcting code DP_B1, bit data DATA_A3[0] through bit data DATA_A3 [n], an A-system error correcting code DP_A3, an A-system code error detecting signal ERROR_A6 and a B-system error correcting code DP_B3 are input into the comparator 602.

Similarly to the comparator 601, the comparator 602 compares the various signal data relating to the data bus $1A_1$ on the CPU side with various signal data relating to the data bus $1A_3$ on the CPU side. When all the data coincide with each other, the comparator 602 outputs a comparison result signal EVEN_A1A3 of "1". Moreover, when even one of the data does not coincide with the other data, the comparator 602 outputs a comparison result signal EVEN_A1A3 of "0".

Similarly, the various signal data relating to the data bus $1A_2$ on the CPU side and signal data relating to the data bus $1A_m$ on the CPU side (in this case, m=3) are input into the comparator 603. More specifically, the bit data DATA_A2 [0] through bit data DATA_A2[n], the A-system error correcting code DP_A2, the A-system code error detecting signal ERROR_A6 and B-system error correcting code DP_2B, the bit data DATA_A3[0] through bit data DATA_A3 [n, the A-system error correcting code DP_A3, the A-system code error detecting signal ERROR_A6 and the B-system error correcting code DP_B3 are input into the comparator 603.

Similarly to the comparator 601, the comparator 603 compares the signal data relating to the data bus $1A_2$ on the CPU side with the signal data relating to the data bus $1A_3$ on the CPU side. When all the data coincide with each other, the comparator 603 outputs a comparison result signal of "1" EVEN_A2A3. Moreover, when even one of the data does not coincide with the other data, the comparator 603 outputs a comparison result signal of "0" EVEN_A2A3.

When one of the following conditions (a) through (c) is satisfied, the MPX 604 outputs the bit data DATA_A1[0] through bit data DATA_A1[n] and the B-system error correcting code DP_B1 as the bit data DATA_B[0] through bit data DATA_B[n] and the B-system error correcting code DP_B to the internal data bus 1B. While doing so, the MPX 604 outputs an A-system code error detecting signal ERROR of "0" which means that a code error is not detected in the data bus $1A_1$ on the CPU side through data bus $1A_m$ on the CPU side.

(a) The comparison result signal EVEN_A1A2 is "1", and the A-system code error detecting signal ERROR_A2 is "0".

(b) The comparison result signal EVEN_A1A3 is "1", and the A-system code error detecting signal ERROR_A2 is "0".

(c) The comparison result signal EVEN_A1A2 =the comparison result signal EVEN_A1A3="1", and the A-system code error detecting signal ERROR_A2 is "0".

Moreover, when the following condition (d) is satisfied, the MPX 604 outputs the bit data DATA_A2[0] through bit data DATA_A2 [n] and the B-system error correcting code DP_B2 as the bit data DATA_B[0] through bit data DATA_B[n] and the B-system error correcting code DP_B to the internal data bus 1B. While doing so, the MPX 604 outputs A-system code error detecting signal ERROR of "0".

(d) The comparison result signal EVEN_A2A3 is "1", and the A-system code error detecting signal ERROR_A4 is "0".

The MPX 604 does not output any data if any of the above conditions (a) through (d) is not satisfied. At this time, the MPX 604 outputs A-system code error detecting signal ERROR of "1" which means that a code error is detected in the data bus $1A_1$ on the CPU side through data bus $1A_m$ on the CPU side. In this case, the above-mentioned code error correction is executed.

As mentioned above, according to the sixth embodiment, when any one of the conditions (a) through (d) is satisfied the MPX 604 outputs the normal data as the bit data DATA_B[0] through bit data DATA_B[n] and B-system error correcting code DP_B to the internal data bus 1B. According to the sixth embodiment, similarly to the fourth embodiment, when a code error occurs under a predetermined condition then the selection circuit 600 outputs the normal data to the internal data bus 1B. As a result, it is not necessary that the CPU 130 executes the code error correction. Therefore, the data transmission efficiency can be improved.

Figure 20:
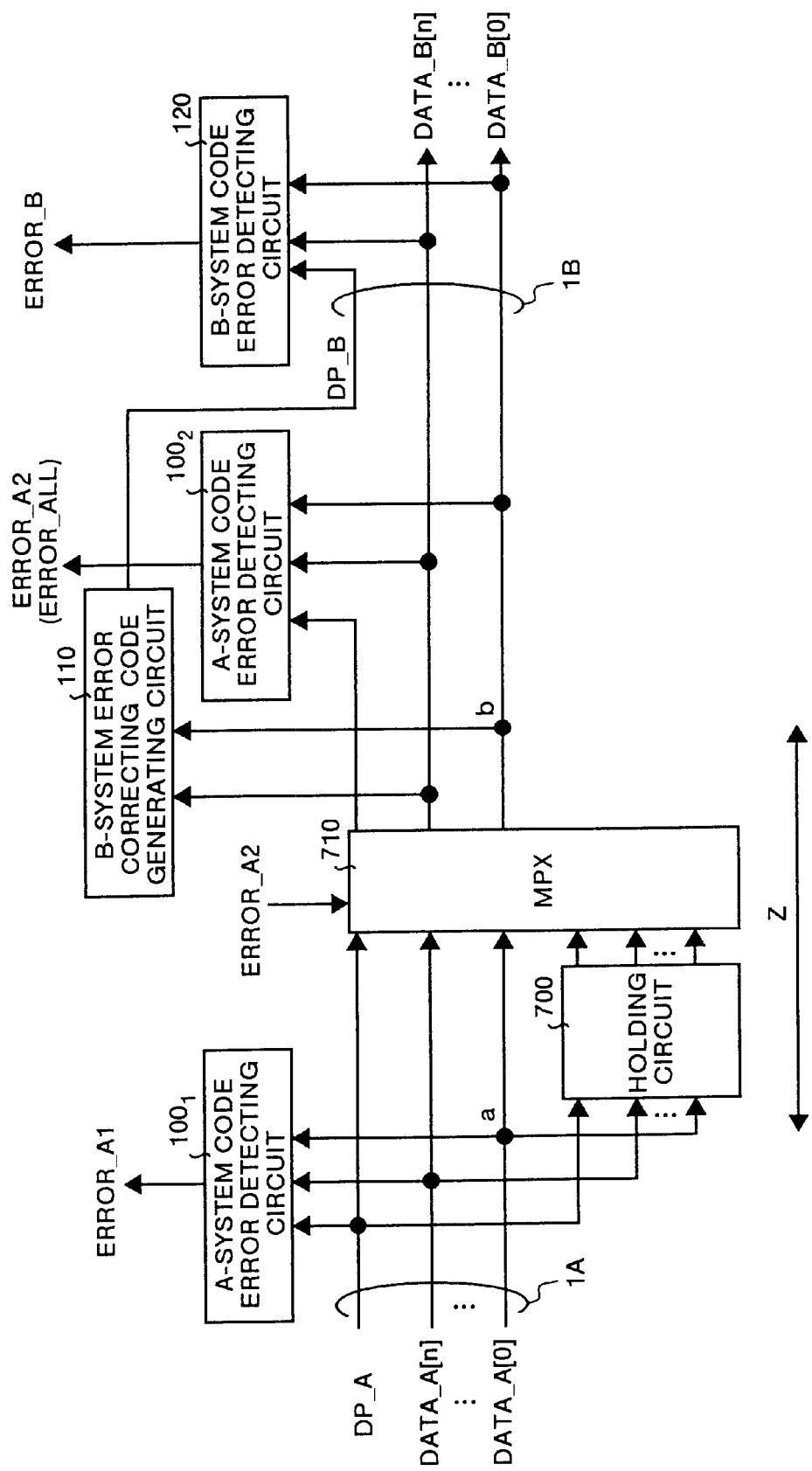
FIG. 20 is a block diagram showing a constitution of a seventh embodiment of the present invention.
Figure 21:
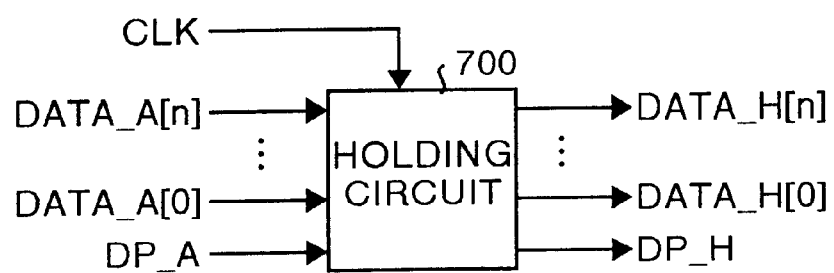
FIG. 21 is a diagram showing a configuration of the holding circuit 700 shown in FIG. 20.

FIG. 20 is a block diagram showing a constitution of a seventh embodiment of the present invention. Same reference numerals are given to sections corresponding to the respective sections in FIG. 1. In FIG. 20, a holding circuit 700 and an MPX 710 are newly provided. As shown in FIG. 21, the holding circuit 700 holds bit data DATA_A[0] through bit data DATA_A[n] and A-system error correcting code DP_A to be used in the A-system code error detecting circuit $100_1$ at leading edge of a clock signal CLK. The holding circuit 700 outputs the held A-system error correcting code DP_H.

Figures 22A, 22B:
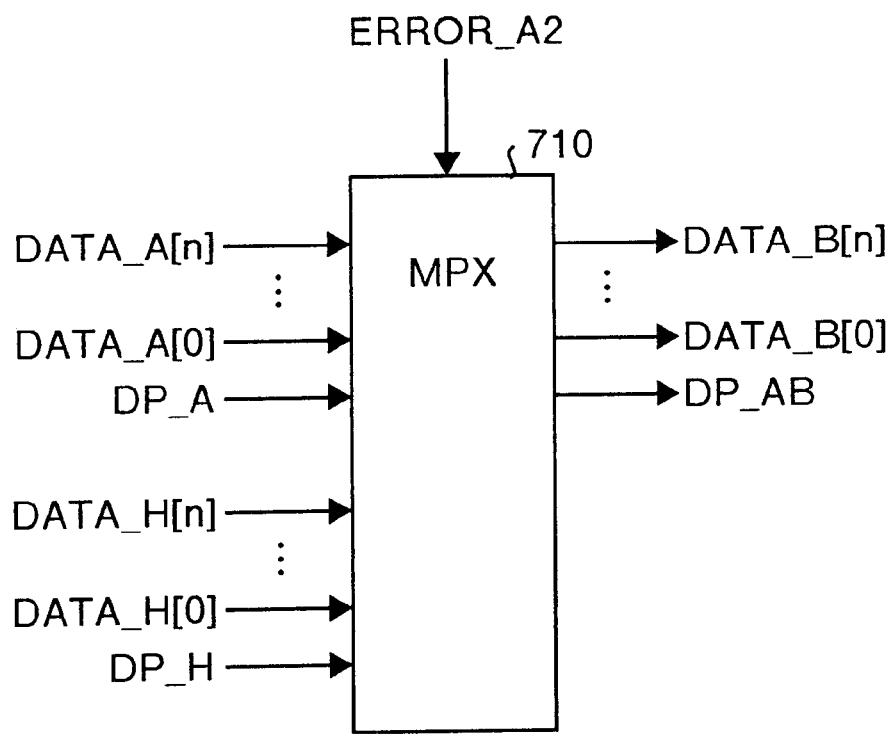
FIG. 22A is a diagram showing a configuration of the MPX 701 shown in FIG. 20
FIG. 22B is a table of truth value.

The MPX 710 is provided in the portion Z on the upstream side of the B-system error correcting code generating circuit 110. As shown in FIG. 22A, the bit data DATA_A(0] through bit data DATA_A[n] and A-system error correcting code DP_A used in the A-system code error detecting circuit $100_1$ are input into the MPX 710. Moreover, the bit data DATA_H[0] through bit data DATA_H[n] and A-system error correcting code DP_H are input from the holding circuit 700 (see FIG. 21) into the MPX 710. Further, the A-system code error detecting signal ERROR_A2 is input from the A-system code error detecting circuit 100$_2$ into the MPX 710.

The MPX 710 performs the switching operation according to a table of truth value shown in FIG. 22B. That is, when A-system code error detecting signal ERROR_A2 of "0" is input, the MPX 710 outputs the bit data DATA_A[0] through bit data DATA_A[n] and A-system error correcting code DP_A as the bit data DATA_B[0] through bit data DATA_B[n] and A-system error correcting code DP_AB to the upstream side of the B-system error correcting code generating circuit 110. In the following description, such a switching state is referred to as a switching OFF.

On the other hand, when the A-system code error detecting signal ERROR_A2 of "1" is input, the MPX 710 outputs the bit data DATA_H[0] through bit data DATA_H[n] and the A-system error correcting code DP_H as the bit data DATA_B[0] through bit data DATA_B[n] and A-system error correcting code DP_AB. In the following description, such a switching state is referred to as a switching ON.

Figure 23:
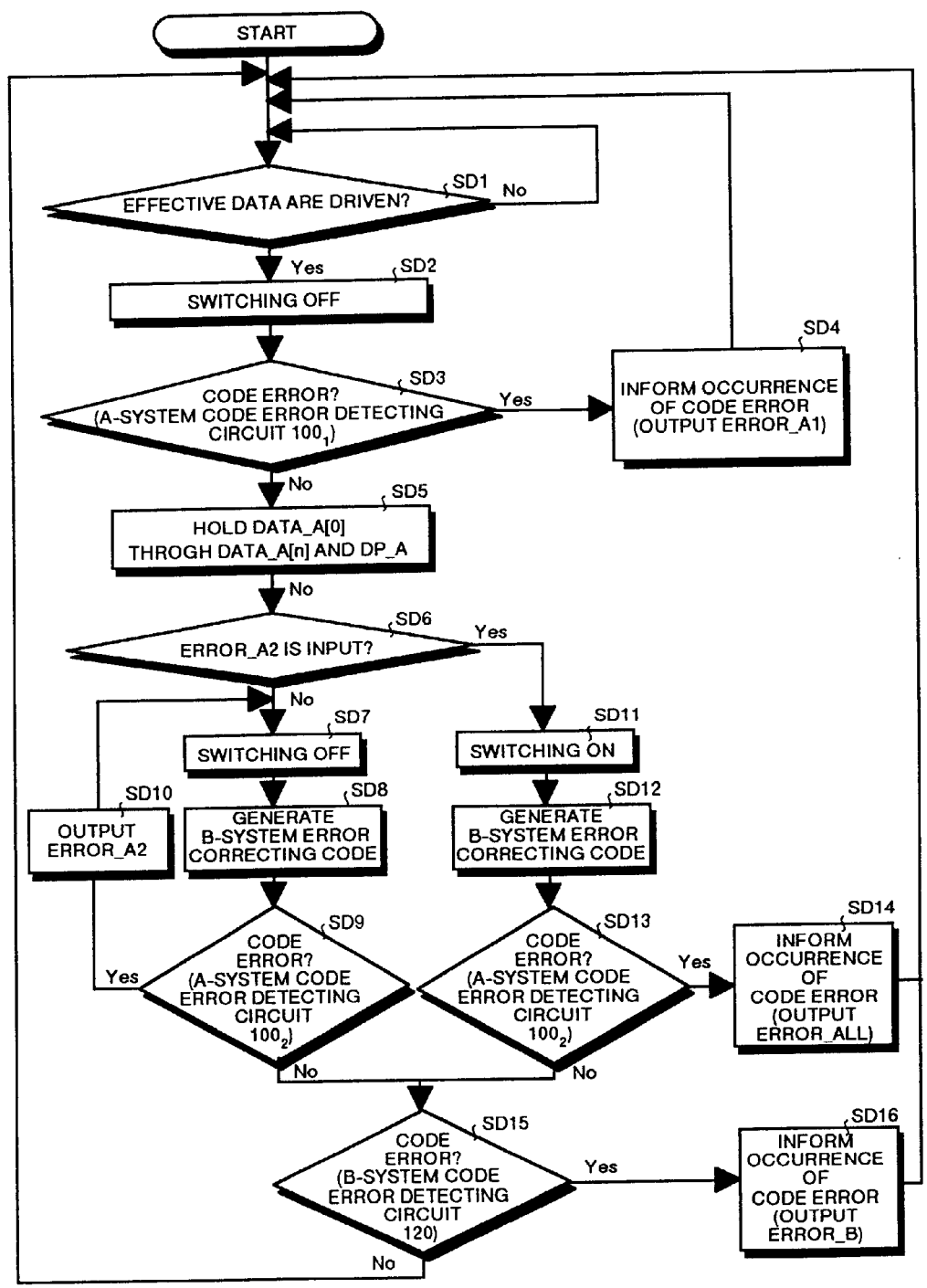
FIG. 23 is a flowchart explaining an operation of the seventh embodiment.

Operation of the seventh embodiment will be described below with reference to a flowchart shown in FIG. 23. In step SD1 shown in FIG. 23 the respective sections do not perform any operation, that is, are in wait state until effective data are driven to the data bus 1A on the CPU side by the CPU 130 (see FIG. 2). The effective data are the A-system bit string composed of the bit data DATA_A[0] through bit data DATA_A[n] and A-system error correcting code DP_A shown in FIG. 20. When the CPU 130 drives the A-system bit string to the data bus 1A on the CPU side, since the A-system code error detecting signal ERROR_A2 is "0", at step SD2 the MPX 710 is in the switching OFF state.

In the next step SD3 the A-system code error detecting circuit 100$_1$ detects as to whether or not a code error has occurred on the upstream side of the point 'a'. When a code error is detected, in step SD4 the A-system code error detecting circuit 100$_1$ outputs A-system code error detecting signal ERROR_A1 of "1". As a result, similarly to the first embodiment, the CPU 130 drives the A-system bit string where the code error has occurred to the data bus 1A on the CPU side so as to execute the code error correction.

On the other hand, when a code error is not detected in step SD3, in step SD5 the normal bit data DATA_A[0] through bit data DATA_A[n] and A-system error correcting code DP_A are held by the holding circuit 700 shown in FIG. 21 at leading edge of a clock signal CLK. In the next step SD6 the MPX 710 judges as to whether or not A-system code error detecting signal ERROR_A2 of "1" is input. That is, the judgment is made as to whether or not a code error is detected by the A-system code error detecting circuit 100$_2$. When the A-system code error detecting signal ERROR_A2 of "1" is not input in step SD6, in other words, when the A-system code error detecting circuit 100$_2$ does not detect a code error, the MPX 710 is in the switching OFF state in step SD7.

In the next step SD8 the B-system error correcting code generating circuit 110 generates a B-system error correcting code DP_B. In the next step SD9 the A-system code error detecting circuit 100$_2$ detects as to whether or not a code error has occurred in the portion Z. When a code error occurs in the portion Z, in step SD10 the A-system code error detecting circuit 100$_2$ outputs A-system code error detecting signal ERROR_A2 of "1". Here, in the seventh embodiment, even when the A-system code error detecting signal ERROR_A2 of "1" is output, the code error correction is not executed.

The MPX 710 performs switching ON state in step SD11. As a result, the MPX 710 outputs the bit data DATA_H[0] through bit data DATA_H[n] and A-system error correcting code DP_H as the bit data DATA_B[0] through bit data DATA_B[n] and A-system error correcting code DP_AB. The bit data DATA_H[0] through bit data DATA_H[n] are normal data.

In the next step SD12 the B-system error correcting code generating circuit 110 generates B-system error correcting code DP_B. In the next step SD13 the A-system code error detecting circuit 100$_2$ detects as to whether or not a code error has occurred in the portion Z. When a code error occurs in the portion Z, in step SD14 the A-system code error detecting circuit 100$_2$ outputs A-system code error detecting signal ERROR_ALL of "1". When the A-system code error detecting signal ERROR_ALL is output, the CPU 130 (see FIG. 2) executes the aforementioned code error correction.

On the other hand, when a code error is not detected in step SD9 or step SD13, then in step SD15 the B-system code error detecting circuit 120 detects as to whether or not a code error has occurred in the internal data bus 1B. When the B-system code error detecting circuit 120 detects a code error, in step SD16 the B-system code error detecting circuit 120 outputs B-system code error detecting signal ERROR_B. As a result, similarly to the first embodiment, the CPU 130 drives again the A-system bit string to the data bus 1A on the CPU side so as to execute the code error correction. When a code error is not detected in step SD15, then in step SD1 the wait state is maintained until effective data are driven.

As described above, according to the seventh embodiment, the holding circuit 700 holds the normal data, and when a code error occurs in the portion Z, the normal data are output to the portion Z, that is, a recovery function is provided. As a result, it is not necessary that the CPU 130 executes the code error correction. Therefore, according to the seventh embodiment, the data transmission efficiency can be improved.

Figure 24:
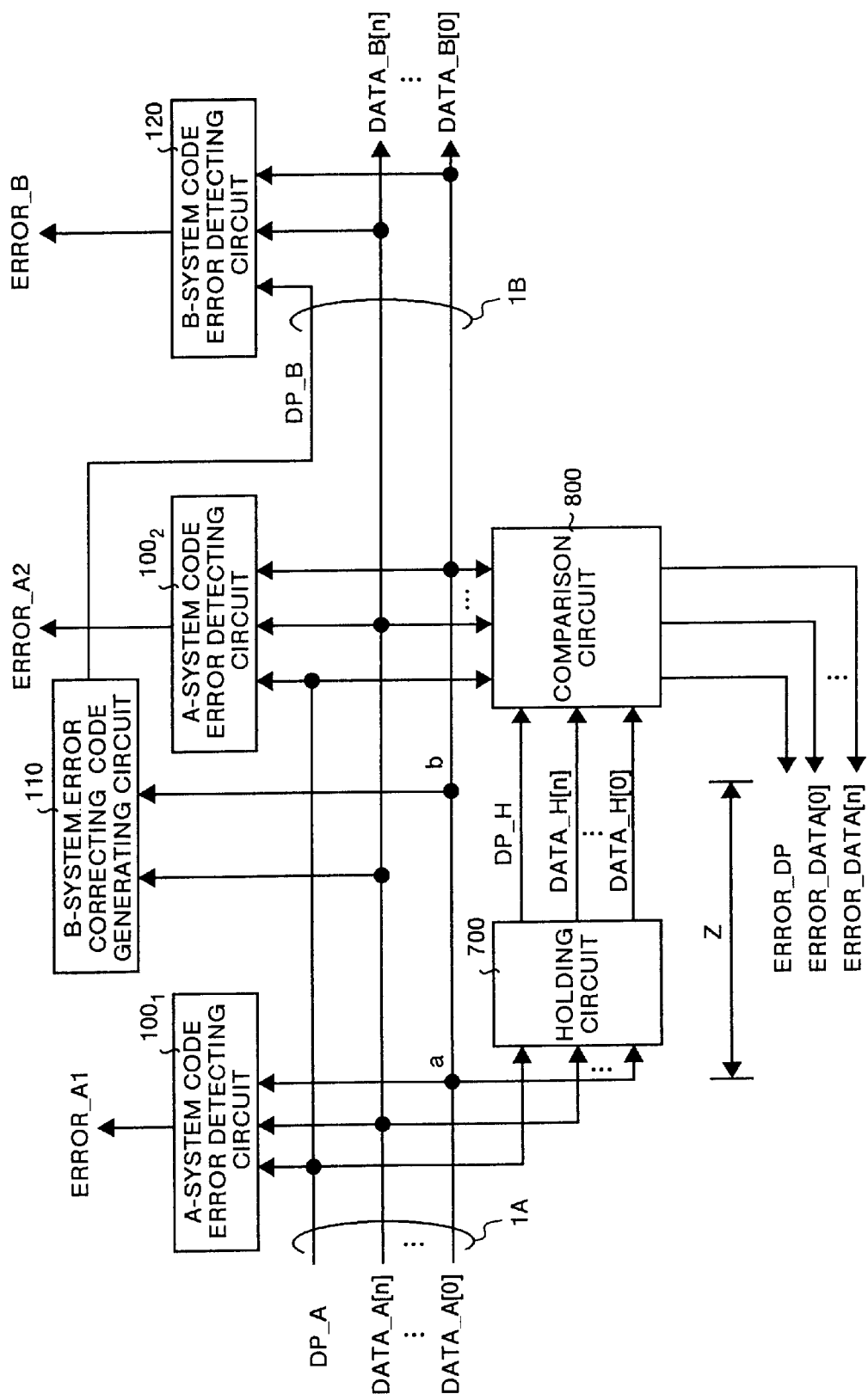
FIG. 24 is a block diagram showing a constitution of an eighth embodiment of the present invention.

FIG. 24 is a block diagram showing a constitution of an eighth embodiment. Same reference numerals are given to sections corresponding to the respective sections in FIG. 20. In FIG. 24, the MPX 710 shown in FIG. 20 is not provided, but a comparison circuit 800 is newly provided. The comparison circuit 800 is provided on the downstream side of the point 'b', and compares the bit data DATA_A[0] through bit data DATA_A[n] and A-system error correcting code DP_A to be used in the A-system code error detecting circuit 100$_1$ with the normal bit data DATA_H[0] through bit data DATA_H[n] and A-system error correcting code DP_H from the holding circuit 700 by a bit unit.

The comparison circuit 800 outputs the comparison results as bit unit code error detecting signal ERROR_DATA[0] through bit unit code error detecting signal ERROR_DATA[n] and bit unit code error detecting signal ERROR_DP. Here, when the comparison results are not coincide in the bit unit code error detecting signal ERROR_DATA[0] through bit unit code error detecting signal ERROR_DATA[n] and bit unit code error detecting signal ERROR_DP, "1" which means that a code error has occurred in the bit is obtained, whereas when the comparison results coincide with each other, "0" which means that the bit is normal is obtained.

Figure 25:
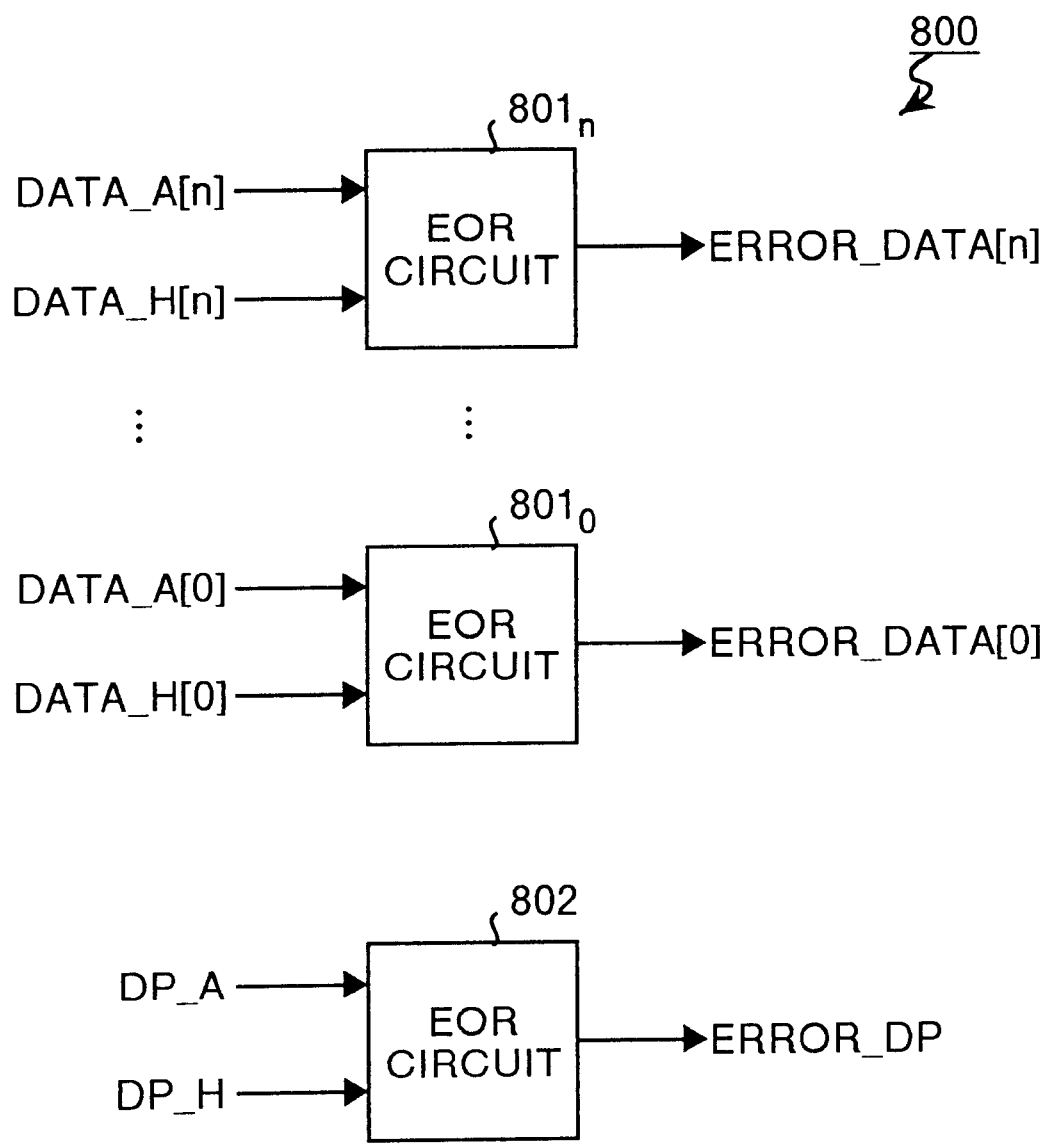
FIG. 25 is a diagram showing the configuration of a comparison circuit 800 shown in FIG. 24.

As shown in FIG. 25, the comparison circuit 800 is composed of EOR circuits 801$_0$ through 801$_n$ and an EOR circuit 802. Bit data DATA_A[0] and bit data DATA_H[0] are input into the EOR circuit 801$_0$. An output signal of the EOR circuit 801$_0$ is a bit unit code error detecting signal ERROR_DATA[0] (see FIG. 24). Similarly bit data DATA_A[n] and bit data DATA_H[n] are input into the EOR circuit 801$_n$, and an output signal of the EOR circuit 801$_n$ is a bit unit code error detecting signal ERROR_DATA[n] (see FIG. 24). Moreover, A-system error correcting code DP_A and A-system error correcting code DP_H are input into the EOR circuit 802, and an output signal of the EOR circuit 802 is a bit unit code error detecting signal ERROR_DP (see FIG. 24).

Figure 26:
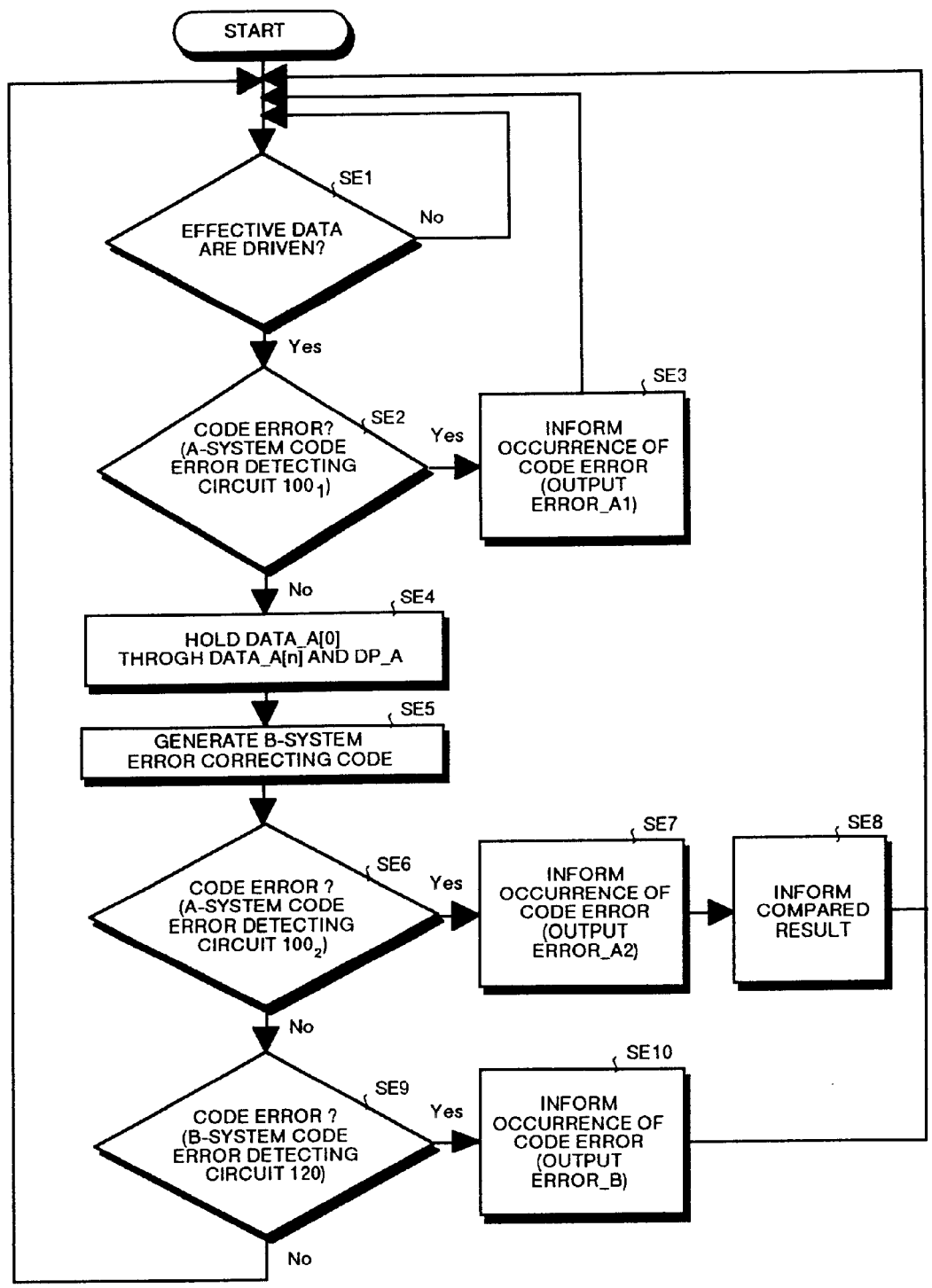
FIG. 26 is a flowchart explaining an operation of the eighth embodiment.

Operation of the eighth embodiment will be described below with reference to a flowchart shown in FIG. 26. In step SE1 shown in FIG. 26 respective sections do not perform any operation and are in wait state until the CPU 130 (see FIG. 2) drives effective data (A-system bit string) to the data bus 1A on the CPU side. When the CPU 130 drives the A-system bit string into the data bus 1A on the CPU side, in step SE2 the A-system code error detecting circuit 100$_1$ detects as to whether or not a code error occurs on the upstream side of the point 'a'. Here, when a code error is detected, in step SE3 the A-system code error detecting circuit 100$_1$ outputs A-system code error detecting signal ERROR_A1 of "1". As a result, similarly to the first embodiment, the aforementioned code error correction is executed.

On the other hand, when a code error is not detected in step SE2, then in step SE4 the holding circuit 700 holds normal bit data DATA_A[0] through bit data DATA_A[n] and A-system error correcting code DP_A. In the next step SE5 the B-system error correcting code generating circuit 110 generates B-system error correcting code DP_B. In the next step SE6 the A-system code error detecting circuit 100$_2$ detects as to whether or not a code error has occurred in the portion Z. When a code error occurs in the portion Z, in step SE7 the A-system code error detecting circuit 100$_2$ outputs A-system code error detecting signal ERROR_A2 of "1".

In the next step SE8 the comparison circuit 800 compares the bit data DATA_A[0] through bit data DATA_A[n] where the code error has occurred and A-system error correcting code DP_A with the normal bit data DATA_H[0] through bit data DATA_H[n] and A-system error correcting code DP_H from the holding circuit 700 by a bit unit. The comparison circuit 800 informs the CPU of the comparison results as bit unit code error detecting signal ERROR_DATA[0] through bit unit code error detecting signal ERROR_DATA[n] and bit unit code error detecting signal ERROR_DP. As a result, the CPU discriminates the bit where a code error occurred from the normal bit in the bit data DATA_A[0] through bit data DATA_A[n] where the code error occurred and A-system error correcting code DP_A.

On the other hand, when a code error is not detected in step SE6, then in step SE9 the B-system code error detecting circuit 120 detects as to whether or not a code error has occurred in the internal data bus 1B. When the B-system code error detecting circuit 120 detects a code error, in step SE10 the B-system code error detecting circuit 120 outputs B-system code error detecting signal ERROR_B. As a result, similarly to the first embodiment, the code error correction is executed. When a code error is not detected in step SE9, then in step SE1 the wait state is maintained until the effective data are driven.

As described above, according to the eighth embodiment, when a code error occurs in the portion Z, the comparison circuit 800 compares the normal data with data where a code error occurred by a bit unit. As a result, a portion where a code error occurred can be easily specified by a bit unit.

As mentioned above, the first embodiment described the constitutional example that the A-system code error detecting circuit 100$_2$ is provided on the downstream side of the B-system error correcting code generating circuit 110 shown in FIG. 2 so as to detect a code error occurred in the portion Z. However, a constitution may be such that detected result of the A-system code error detecting circuit 100$_2$ is effective or ineffective. Such a constitutional example will be describe below as a ninth embodiment.

Figures 27A, 27B:
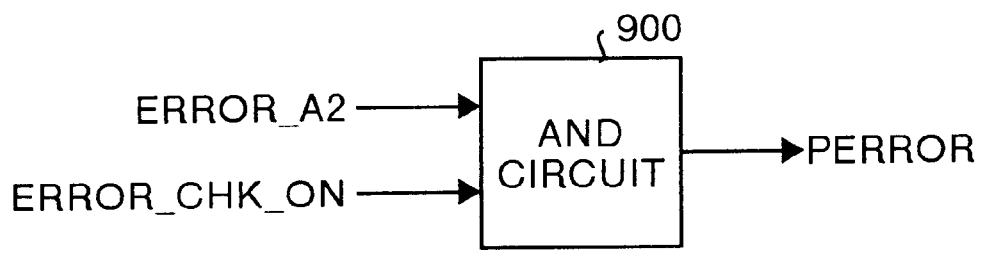
FIG. 27A is a diagram showing a constitution of a main section according to a ninth embodiment of the present invention and FIG. 27B is a table of truth value.

FIG. 27A is a diagram showing a constitution of a main section according to the ninth embodiment of the present invention. An AND circuit 900 shown in this drawing is provided between the A-system code error detecting circuit 100$_2$ and the CPU-internal bus protocol converting circuit 140 shown in FIG. 2. The AND circuit 900 serves as a control unit for making A-system code error detecting signal ERROR_A2 from the A-system code error detecting circuit 100$_2$ effective or ineffective. That is, as well as the A-system code error detecting signal ERROR_A2, a control signal ERROR_CHK_ON from the CPU 130 is input into the AND circuit 900. Moreover, an output signal of the AND circuit 900 is output as A-system code error detecting signal PERROR to the CPU-internal bus protocol converting circuit 140.

FIG. 27A is a diagram showing a table of truth value in the AND circuit 900. As shown in this drawing, when the A-system code error detecting signal ERROR_A2 is made to be ineffective, a control signal ERROR_CHK_ON of "" is input into the AND circuit 900. On the other hand, when the A-system code error detecting signal ERROR_A2 is made to be effective, a control signal ERROR_CHK_ON of "1" is input into the AND circuit 900. Here, the AND circuit 900 can be applied also to the second through eighth embodiments.

As mentioned above, according to the ninth embodiment, since the AND circuit 900 is provided, when data in which some code error is permissible, for example (image data or the like) are transmitted, the A-system code error detecting signal ERROR_A2 from the A-system code error detecting circuit 100$_2$ can be made to be ineffective. As a result, versatility is improved.

First through ninth embodiments of the present invention are described above with reference to the drawings, but the concrete constitutional example is not limited to the first through ninth embodiments, and the invention includes variation of the design within the scope which does not deviate from gist of the invention. For example, the aforementioned first through ninth embodiments described the example which is applied to the data bus composed of the data bus 1A on the CPU side and the internal data bus 1B, but it can be applied to any case as long as a code error is detected.

In addition, the first through ninth embodiments described the odd parity check system as the system A and the even parity check system as the system B as one example of different code error detecting systems, but the present invention is not limited to them, and thus any sort of another code error detecting systems can be used.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:
1. A code error monitor apparatus comprising:
   a first A-system code error detecting unit detecting a code error of data on a data transmission line according to a system A;

a B-system code error detecting unit provided on a downstream side of said A-system code error detecting unit and detecting a code error of the data based on a B-system error correcting code according to a system B which is different from the system A;

a B-system error correcting code generating unit provided on downstream side of said first A-system code error detecting unit and on an upstream side of the B-system code error detecting unit, and generating the B-system error correcting code based on the data supplied to said A-system code error detecting unit; and a second A-system code error detecting unit provided on the downstream side of said B-system error correcting code generating unit and on the upstream side of the B-system code error detecting unit, and detecting a code error of the data to be used for generating the B-system error correcting code according to the system A.

2. The code error monitor apparatus according to claim 1, further comprising a plurality of A-system code error detecting units provided on the downstream side of the second A-system code error detecting unit and on the upstream side of the B-system code error detecting unit, and correcting a code error of the data based on detected results of the plurality of the A-system code error detecting units.

3. The code error monitor apparatus according to claim 1, further comprising a correcting unit correcting a code error of the data based on detected results of said first and second A-system code error detecting units.

4. The code error monitor apparatus according to claim 1, further comprising:

a holding unit holding normal data where a code error was not detected by said first A-system code error detecting unit on the upstream side; and a switching unit provided on an upstream side of said B-system error correcting code generating unit and when a code error is detected by said first A-system code error detecting unit, transmitting the normal data held by said holding unit to said data transmission line instead of the data where a code error was detected.

5. The code error monitor apparatus according to claim 1, further comprising:

a holding unit holding normal data where a code error was not detected by said first A-system code error detecting unit on the upstream side; and a comparison unit for when a code error is detected by said first A-system code error detecting unit, comparing the data where the code error was detected and the normal data held by said holding unit, and outputting an error detecting signal according to the comparing.

6. A code error monitor apparatus, comprising:

a first A-system code error detecting unit detecting a code error of data on a data transmission line according to a system A;

a B-system code error detecting unit provided on a downstream side of said A-system code error detecting unit and detecting a code error of the data based on a B-system error correcting code according to a system B different from the system A;

a B-system error correcting code generating unit provided on a downstream side of the first A-system code error detecting unit and on an upstream side of the B-system code error detecting unit, and generating the B-system error correcting code based on the data supplied to said first A-system code error detecting unit; and a plurality of second A-system code error detecting units provided on the downstream side of the B-system error correcting code generating unit and on the upstream side of the B-system code error detecting unit, and correcting a code error of the data based on detected results of said plurality of A-system code error detecting units.

7. A code error monitor apparatus comprising:

a branched data transmission line;

a first A-system code error detecting unit detecting a code error of data on the data transmission line according to a system A;

a B-system code error detecting unit provided on a downstream side of said A-system code error detecting unit and detecting a code error of the data based on a B-system error correcting code according to a system B different from the system A;

a B-system error correcting code generating unit provided on a downstream side of said first A-system code error detecting unit and on an upstream side of the B-system code error detecting unit, and generating the B-system error correcting code based on the data supplied to said first A-system code error detecting unit;

a plurality of second A-system code error detecting units provided on the downstream side of the B-system error correcting code generating unit and on the upstream side of the B-system code error detecting unit, and detecting a code error of the data to be used for generating the B-system error correcting code according to the system A;

a first A-system code error detecting unit provided on the branch side of the transmission line and detecting a code error of the data according to the system A;

a B-system error correcting code generating unit provided on the branch side of the transmission line, which is provided on an upstream side of said branch side A-system code error detecting unit, and generating a B-system error correcting code based on the data supplied to said A-system code error detecting unit on the branch side;

a plurality of second A-system code error detecting units provided on the branch side of the transmission line on the downstream side of the branch side B-system error correcting code generating unit and on the upstream side of the B-system code error detecting unit, and detecting a code error of the data to be used for generating the B-system error correcting code on the branch side according to the system A; and a selection unit selecting data on the data transmission line on the upstream side of said B-system error detecting unit or on the branch side of the data transmission line based on detected results of said transmission line A-system error detecting units and said branch side A-system code error detecting units.

* * * * *

UNITED STATES PATENT AND TRADEMARK OFFICE
CERTIFICATE OF CORRECTION

PATENT NO. : 6,678,858 B1
DATED : January 13, 2004
INVENTOR(S) : Takashi Imazato et al.

It is certified that error appears in the above-identified patent and that said Letters Patent is hereby corrected as shown below:

Column 27,
Line 7, insert "a" before "downstream".
Line 11, insert -- first -- before "A-system"; and Column 28,
Line 13, insert comma -- , -- before "comprising".

Signed and Sealed this

Thirtieth Day of March, 2004

JON W. DUDAS
*Acting Director of the United States Patent and Trademark Office*